United States Patent
Tan

(10) Patent No.: US 7,863,063 B2
(45) Date of Patent: Jan. 4, 2011

(54) METHOD FOR FABRICATING A SEALED CAVITY MICROSTRUCTURE

(75) Inventor: Siew-Seong Tan, Hsinchu (TW)

(73) Assignee: MEMSmart Semiconductor Corp., Hsinchu (TW)

( * ) Notice: Subject to any disclaimer, the term of this patent is extended or adjusted under 35 U.S.C. 154(b) by 415 days.

(21) Appl. No.: 12/042,289

(22) Filed: Mar. 4, 2008

(65) Prior Publication Data

US 2009/0227060 A1 Sep. 10, 2009

(51) Int. Cl.
*H01L 21/00* (2006.01)
(52) U.S. Cl. .............. 438/26; 438/51; 438/55; 438/64; 257/E31.11
(58) Field of Classification Search ............. 438/26, 438/51, 55, 64
See application file for complete search history.

(56) References Cited

U.S. PATENT DOCUMENTS

| | | | |
|---|---|---|---|
| 7,736,929 B1 * | 6/2010 | Monadgemi et al. ........ | 438/51 |
| 2005/0260783 A1 * | 11/2005 | Lutz et al. .................. | 438/51 |
| 2007/0287215 A1 * | 12/2007 | Utsumi et al. ............... | 438/51 |
| 2009/0061578 A1 * | 3/2009 | Tan et al. .................... | 438/200 |
| 2009/0108381 A1 * | 4/2009 | Buchwalter et al. ........ | 257/415 |
| 2009/0230499 A1 * | 9/2009 | Warsop et al. .............. | 257/467 |
| 2009/0243084 A1 * | 10/2009 | Tan ............................. | 257/704 |
| 2010/0022046 A1 * | 1/2010 | Utsumi et al. ............... | 438/51 |

* cited by examiner

*Primary Examiner*—David A Zarneke
(74) *Attorney, Agent, or Firm*—Banger Shia

(57) ABSTRACT

A method for fabricating a sealed cavity microstructure comprises the steps of: forming an insulation layer with a micro-electro-mechanical structure on an upper surface of a silicon substrate, the micro-electro-mechanical structure includes at least one suspended structure and at least one conductive structure between which is disposed a spacer region; after an etching, filling a sacrificial layer into the spacer region and on the surface of the conductive structure; forming holes in the sacrificial layer correspondingly to the conductive structure; depositing a cap layer into the holes and the surface; after removing the sacrificial layer, utilizing the clearance of the cap layer to carry out a further etching to realize the suspension of the micro-electro-mechanical structure; and finally, utilizing a sealing layer to achieve the sealing effect. By such arrangements, the exposure of the micro-electro-mechanical structure can be effectively prevented, and the final package cost can be reduced.

6 Claims, 20 Drawing Sheets

METHOD FOR FABRICATING A SEALED CAVITY MICROSTRUCTURE

BACKGROUND OF THE INVENTION

1. Field of the Invention

The present invention relates to a method for fabricating a micro-electro-mechanical structure, and more particularly to a method for fabricating a sealed cavity microstructure, which can effectively avoid improper erosion, reduce the probability of exposure and further reduce the package cost by being packed and integrated with a general integrated circuit.

2. Description of the Prior Art

The existing semiconductor micro-electro-mechanical system include various semiconductor microstructures, such as the unmovable probe, channel, cavity structure, or the movable spring, linkage rod, gear (rigid body movement or flexible deformation), etc.

Integrating the above different structures with the related semiconductor circuit can form various semiconductor applications. Thus, how to utilize the fabricating method to improve the various functions of the microstructure is the key index of the semiconductor electromechanical system in the future and is also a rigorous challenge of further developing the chip in the future.

The existing method for fabricating the micro-electro-mechanical sensor and actuator system is often required to fabricate a suspended structure on a silicon substrate. The above process must adopt the advanced semiconductor technology such as dry etching, wet etching and gas etching to remove the sacrificial layer and form suspension micro-electro-mechanical systems inside components. These micro-electro-mechanical systems can cause high sensitive action and can be widely applied to the production designs.

A conventional method disclosed in U.S. Pat. No. 6,458,615 B1 is to form at least one insulation layer including an inner micro-electro-mechanical structure on an upper surface of a silicon substrate, and then conduct a layer-by-layer etching operation from the upper surface until the lateral edge of the micro-electro-mechanical structure, and finally, conduct an isotropic dry etching to the silicon substrate to achieve the suspension of the micro-electro-mechanical structure.

The above conventional method can be used to fabricate a suspended micro-electro-mechanical structure, but it has the following disadvantages:

First, it adopts anisotropic dry chemical etching and uses chemical reaction to remove the isolation layer, however, after the side edge of the micro-electro-mechanical structure is etched, the silicon substrate still needs to be massively etched by isotropic chemical etching, and this technique will produce serious undercut problems;

Second, in the process of this conventional technology, the micro-electro-mechanical structure is exposed in the process at first, after a long time of multi-layer processing, the exposed micro-electro-mechanical structure is likely to be contaminated and damaged, causing an excessively low yield rate;

Third, after the etching operation is completed, the micro-electro-mechanical structure has already been capable of operating in suspended state, but a special machine will be used to pack the micro-electro-mechanical structure surface to block dust and particle. However, since the micro-electromechanical structure must be ensured in the suspended state, the conventional method is to place a special mold used as a cap over the product surface, and then precisely fabricate a package protection cap without touching the suspended micro-electro-mechanical structure. This kind of surface package is complicated and expensive, and unlikely to be integrated with the process of the common integrated circuit package.

With the rapid development of the above technology, in order to solve many problems, U.S. Pat. No. 7,008,812B1 discloses a manufacture of MEMS structures in sealed cavity which utilizes two sacrificial layers to clad the suspended micro-electro-mechanical part from the upper side and the lower side, respectively. Moreover, after the sacrificial layer utilizes a cap structure to protect the inner suspended micro-electro-mechanical part, holes are made in the cap structure to etch the two sacrificial layers inside the cap structure. Outside the cap structure is covered another protective layer to define a sealed cavity, thus realizing the effective suspension of the micro-electro-mechanical suspended part. This technology can greatly reduce the probability of the micro-electro-mechanical exposure, but it has the following disadvantages:

The two sacrificial layers must clad the suspended micro-electro-mechanical part from the upper side and the lower side respectively, the fabrication of the two sacrificial layers wastes more time and labour, and the mask alignment and photolithography technology used together with the micro-electro-mechanical suspended part is quite fine, so this improved technology is still more troublesome and complicated;

The above problems caused in the sealed cavity micro-electro-mechanical structure fabrication haven't been solved yet, and they are also the key points of continuously looking for breakthroughs in the existing semiconductor microstructure design and fabrication, and the package industry.

The present invention has arisen to mitigate and/or obviate the afore-described disadvantages.

SUMMARY OF THE INVENTION

The primary objective of the present invention is to provide a method for fabricating a sealed cavity microstructure, which can effectively reduce the exposure of the micro-electro-mechanical structure and the package cost.

In order to achieve the above objective, the fabricating method in accordance with the present invention comprises the steps of: forming an insulation layer with a micro-electro-mechanical structure on an upper surface of a silicon substrate, the micro-electro-mechanical structure includes at least one suspended structure having spacer regions; after an etching operation, filling a sacrificial layer into the spacer regions and the surface; subsequently forming holes in the sacrificial layer; and depositing a cap layer into the holes and on the surface. By such arrangements, the present invention can create the effect of reducing the exposure probability of the micro-electro-mechanical structure.

When the sacrificial layer is removed, the silicon substrate located beneath the suspended structure is etched by use of the clearance of the cap layer, realizing the suspension of the suspended structure of the micro-electro-structure. Ultimately, a sealing layer is used to clad the cap layer to seal the clearance of the cap layer.

Therefore, the present invention can not only effectively prevent the exposure of the micro-electro-mechanical structure, but directly utilize the etching of the silicon substrate to realize the suspension of the suspended structure, thus reducing the package cost and troublesome procedures caused by fabricating multiple sacrificial layers.

The second objective of the present invention is to provide a method for fabricating a sealed cavity microstructure, which utilizes the cap layer to form a function component.

In order to achieve the above objective, the method for fabricating a sealed cavity microstructure of the present invention comprises the steps of: forming at least one insulation layer with a micro-electro-mechanical structure on an upper surface of a silicon substrate, the micro-electro-mechanical structure includes at least one suspended structure and at least one conductive structure between which is disposed a spacer region; filling a sacrificial layer into the spacer regions and over the conductive structure after an etching operation; forming holes in the sacrificial layer correspondingly to the conductive structure; depositing a cap layer into the holes and on the surface, the cap layer is made of a conductive material, and the cap layer electrically connects with the conductive structure; and finally, cladding a sealing layer outside the cap layer after removing the sacrificial layer and etching the silicon substrate.

Therefore, the electrical conduction of the cap layer and the micro-electro-mechanical structure can be directly integrated and designed as a part of an electric circuit, thus effectively increasing the functions of the cap layer after the fabricating process, and reducing the package cost.

It is important that, since the cap layer over the upper surface of the insulation layer can be directly used as an hermetic protective layer during the etching of the micro-electro-mechanical structure, and then using the etching of the silicon substrate achieves the suspension of the suspended structure, thus reducing the package cost and the troublesome working procedures that are caused by fabricating multiple sacrificial layers. The present invention indeed can breakthrough the bottleneck of the conventional technology and develop a new technology that has never been known before.

It is to be noted that, the etching technology in accordance with the present invention may adopt the reactive ion etching (RIE) or the dry type deep reactive ion etching (DRIE) according to the requirements.

The dry type DRIE is an anisotropic etching technology which is recognized as a very important etching technology in recent years, which utilizes the protective layer formed during the etching process to prevent the undercut problem and achieve high-aspect ratio structure. Therefore, etched structure and shape is free of the influence of the lattice plane and don't have convex corner and undercut. Hence, it can be etched into various shaped holes or convex blocks. In addition, with the reactive ion etching lag, the surface of the substrate can be etched to have different heights.

In addition, the cap layer may be made of one of the conductive materials: aluminum, nickel, silver, copper, titanium, tungsten and gold according to the requirements, and the conductive cap layer can be used as a connection part of an electric circuit and to finish the package operation synchronously.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
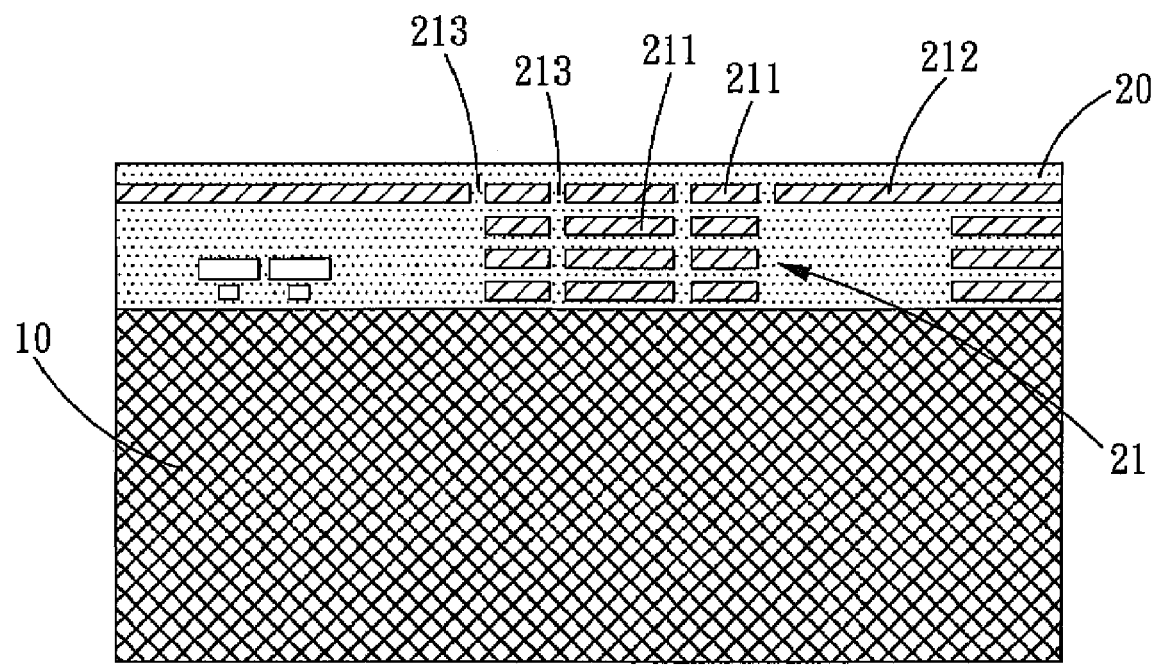
FIG. 1 is a cross sectional view showing a first step of a method for fabricating a sealed cavity microstructure in accordance with a first embodiment of the present invention.
Figure 2:
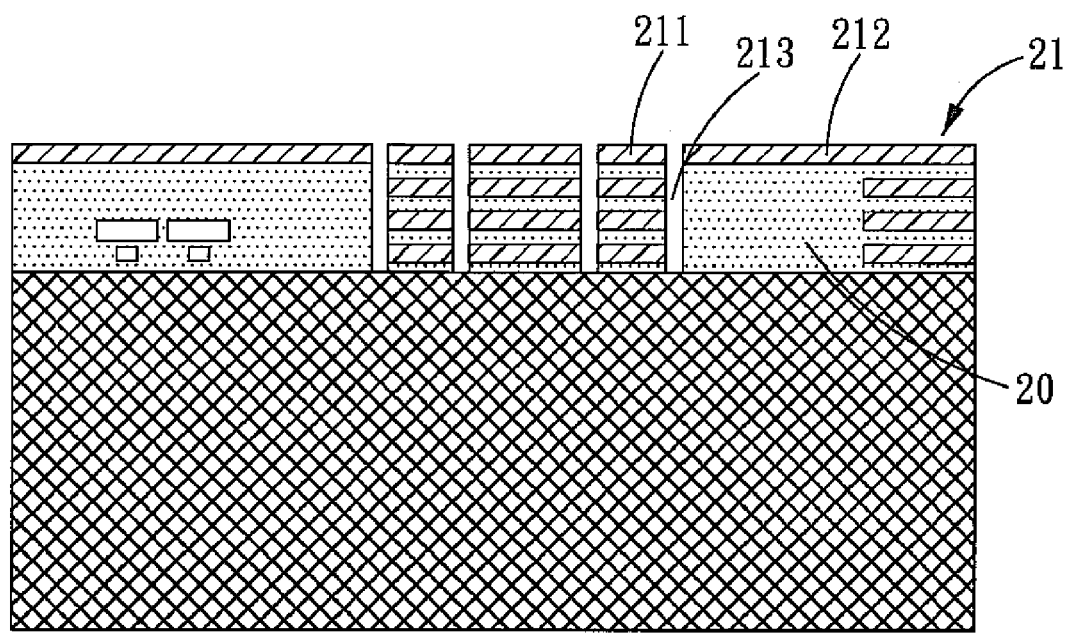
FIG. 2 is a cross sectional view showing a second step of the method for fabricating a sealed cavity microstructure in accordance with the first embodiment of the present invention.
Figure 3:
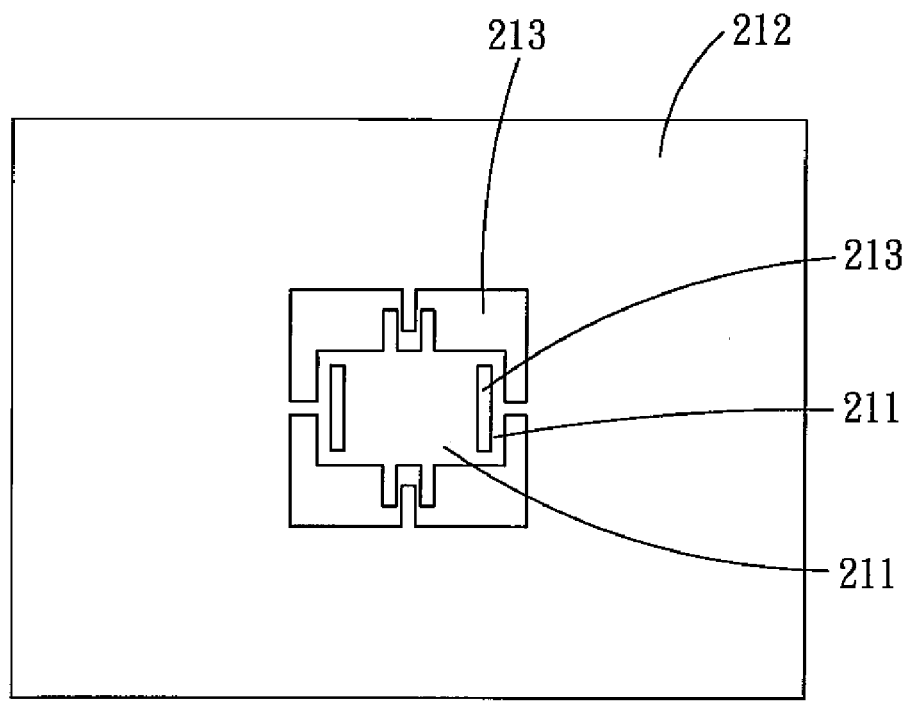
FIG. 3 is a cross sectional view showing a third step of the method for fabricating a sealed cavity microstructure in accordance with the first embodiment of the present invention.
Figure 4:
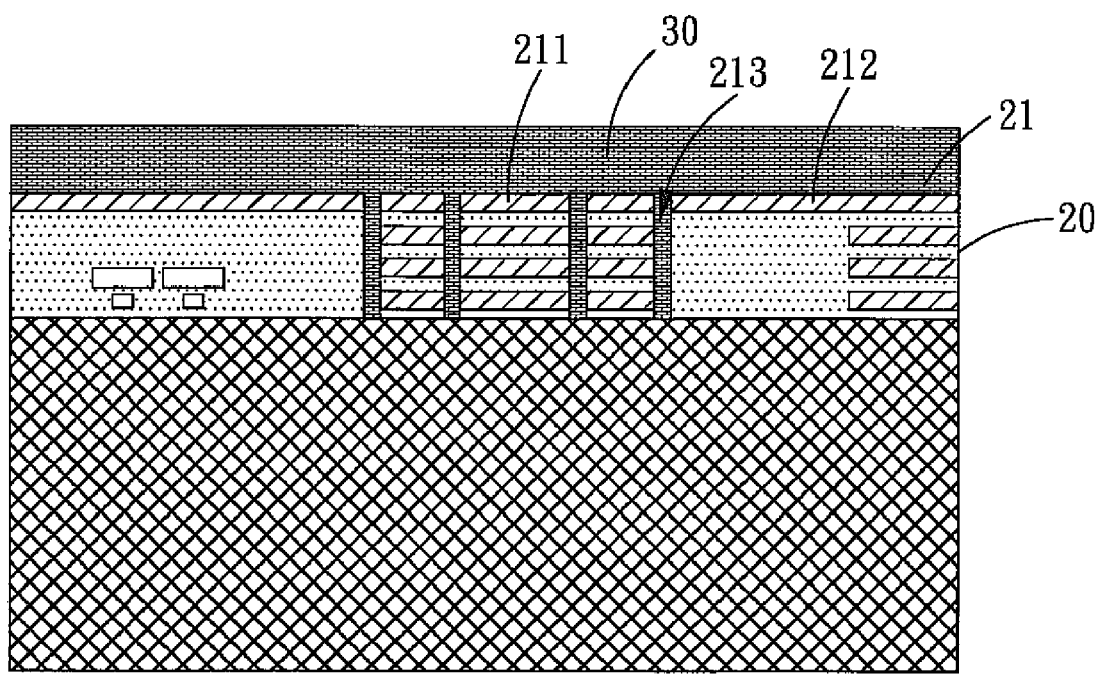
FIG. 4 is a cross sectional view showing a fourth step of the method for fabricating a sealed cavity microstructure in accordance with the first embodiment of the present invention.
Figure 5:
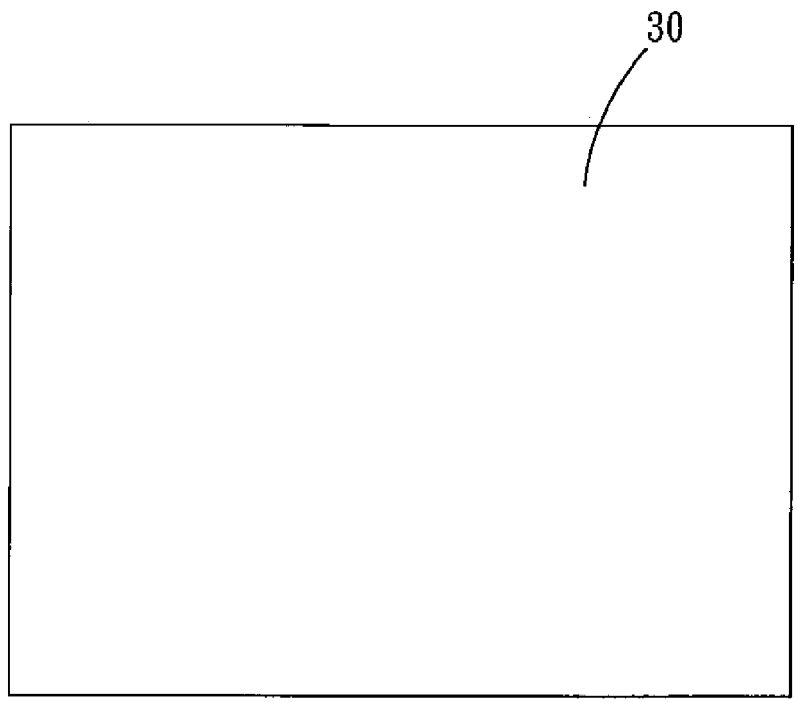
FIG. 5 is a cross sectional view showing a fifth step of the method for fabricating a sealed cavity microstructure in accordance with the first embodiment of the present invention.
Figure 6:
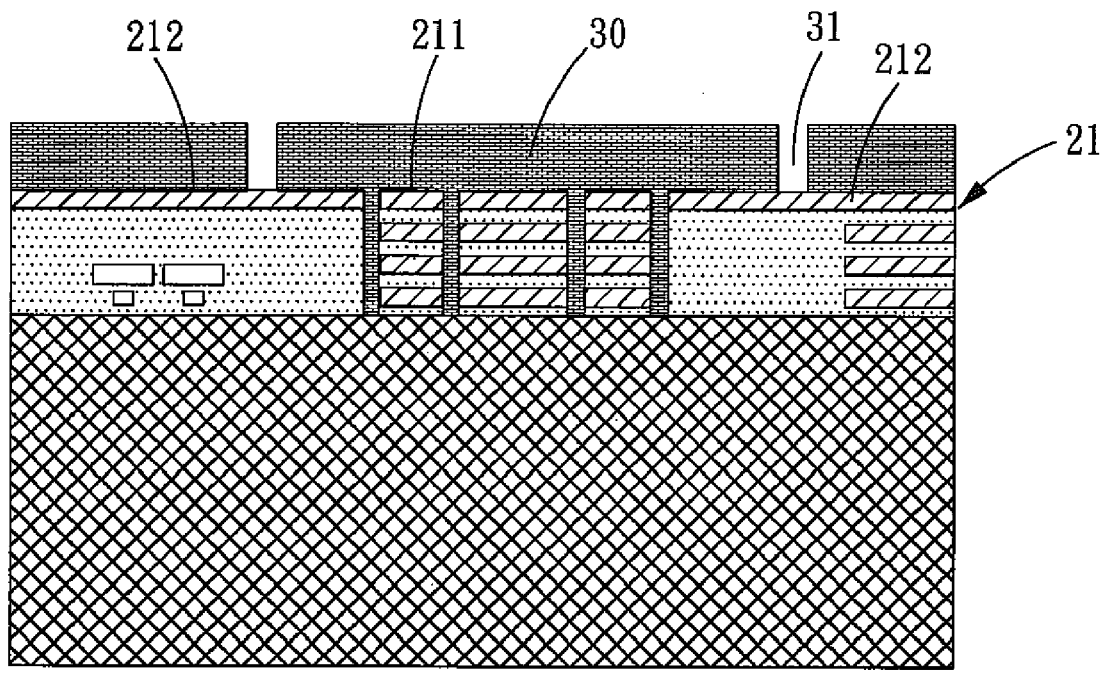
FIG. 6 is a cross sectional view showing a sixth step of the method for fabricating a sealed cavity microstructure in accordance with the first embodiment of the present invention.
Figure 7:
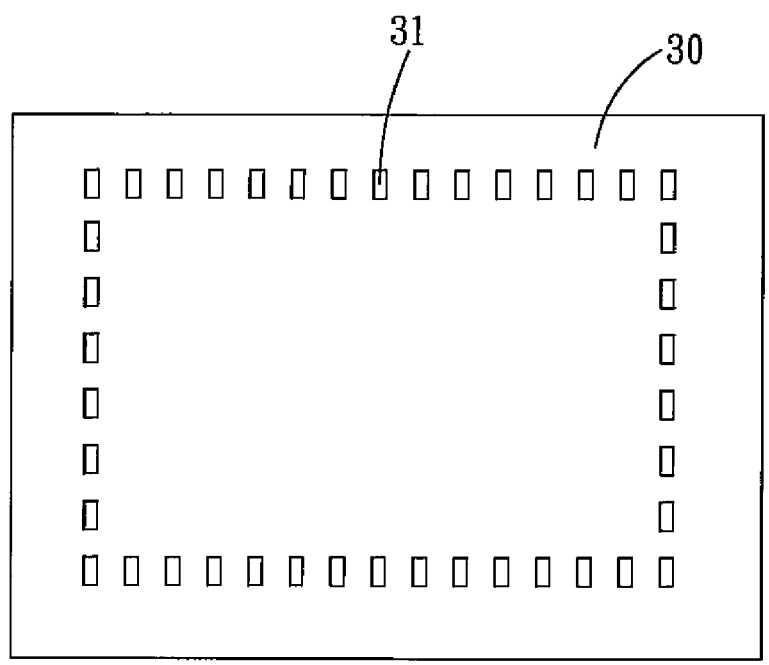
FIG. 7 is a cross sectional view showing a seventh step of the method for fabricating a sealed cavity microstructure in accordance with the first embodiment of the present invention.
Figure 8:
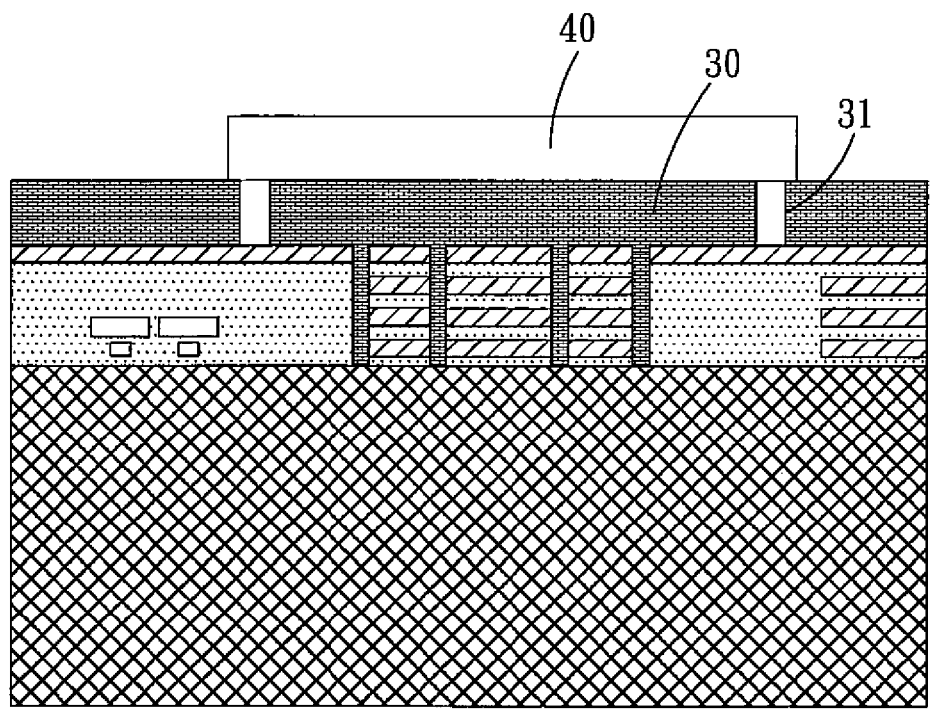
FIG. 8 is a cross sectional view showing an eighth step of the method for fabricating a sealed cavity microstructure in accordance with the first embodiment of the present invention.
Figure 9:
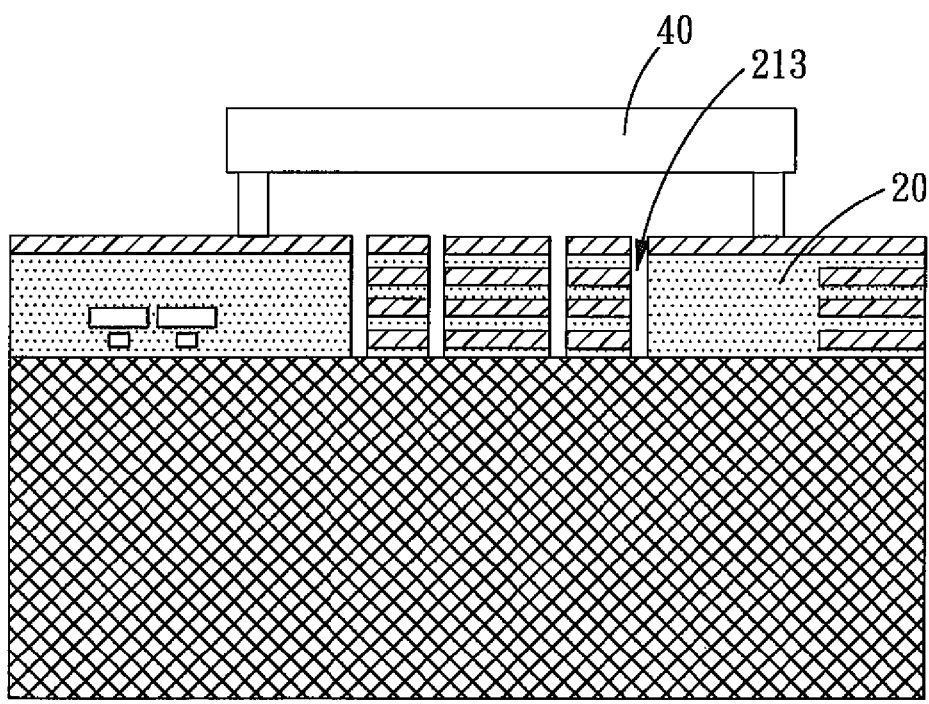
FIG. 9 is a cross sectional view showing a ninth step of the method for fabricating a sealed cavity microstructure in accordance with the first embodiment of the present invention.
Figure 10:
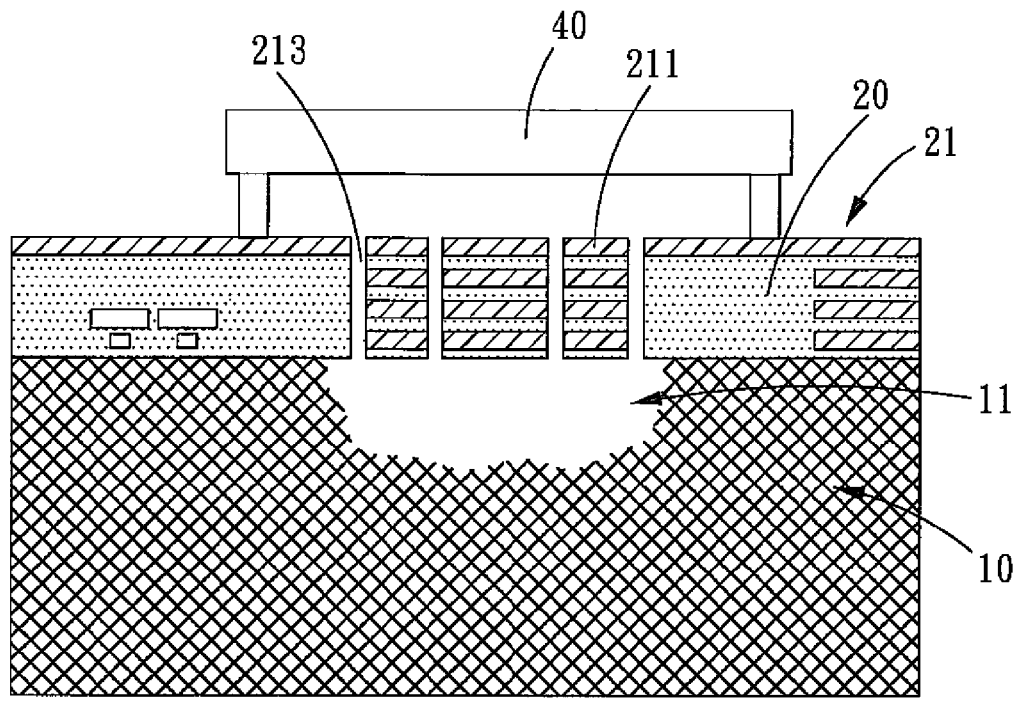
FIG. 10 is a cross sectional view showing a tenth step of the method for fabricating a sealed cavity microstructure in accordance with the first embodiment of the present invention.
Figure 11:
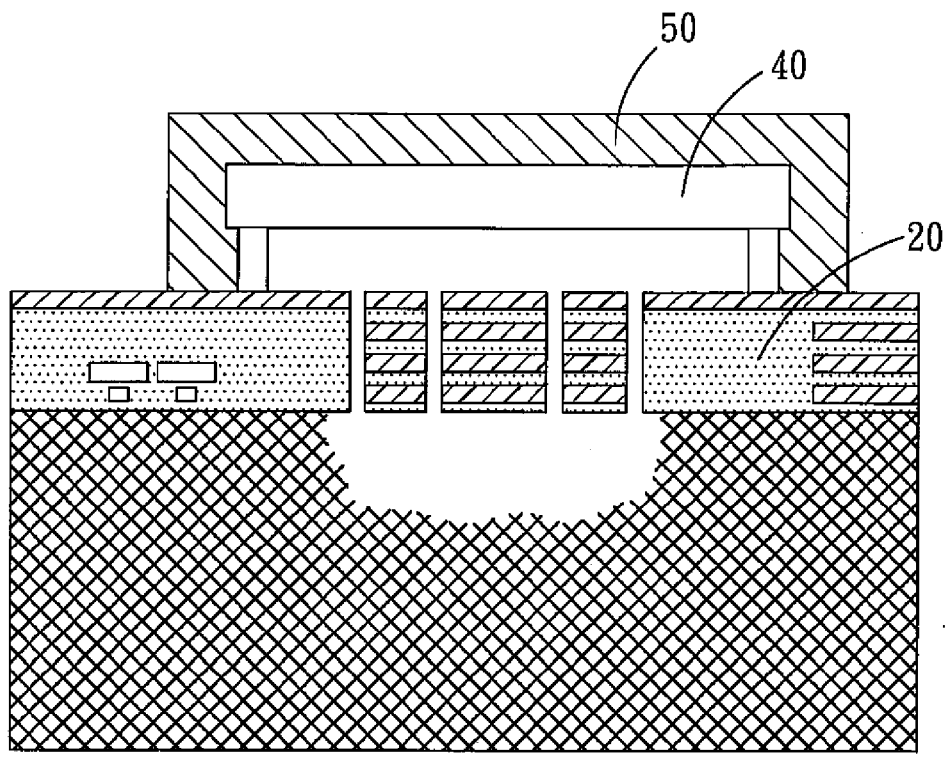
FIG. 11 is a cross sectional view showing an eleventh step of the method for fabricating a sealed cavity microstructure in accordance with the first embodiment of the present invention.

Referring to FIGS. 1-11, a method for fabricating a sealed cavity microstructure in accordance with a first embodiment of the present invention comprises the following steps:

As shown in FIG. 1, firstly forming an insulation layer 20 with a micro-electro-mechanical structure 21 on an upper surface of a silicon substrate, the micro-electro-mechanical structure 21 includes a plurality groups of stacked suspended structures 211 (each group has a plurality of suspended structures 211) and at least one conductive layer 212 surrounding thereof, between the respective suspended structures 211 and between the respective structures 211 and the conductive structure 212 are both disposed spacer regions 213, the micro-electro-mechanical structure 21 is clad by the insulation layer 20;

As shown in FIGS. 2 and 3, conducting an reactive ion etching (RIE) to the insulation layer 20, after the insulation layer 20 is etched by RIE, the suspended structures 211 and the conductive structure 212 of the micro-electro-mechanical structure 21 are exposed outside, and the spacer regions 213 between the respective suspended structures 211 and the spacer regions 213 between the respective suspended structures 211 and the conductive structure 212 are etched into hollow configurations;

As shown in FIGS. 4 and 5, subsequently cladding a sacrificial layer 30 over the insulation layer, the sacrificial layer 30 is filled into the spacer regions 213, and the sacrificial layer 30 is covered over the surfaces of the suspended structures 211 and the conductive structure 212 of the micro-electro-mechanical structure 21;

As shown in FIGS. 6 and 7, forming a plurality of holes in the sacrificial layer 30, the holes 31 are regularly formed over the conductive structure 212, and the holes 31 reach to the surface of the conductive structure 212 of the micro-electro-mechanical structure 21 and arranged surrounding the suspended structures 211 of the micro-electro-mechanical structure 21;

As shown in FIG. 8, depositing a cap layer 40 on the surface of the sacrificial layer 30, the cap layer 40 covers the plurality of holes 31 and is filled into the holes 31;

As shown in FIG. 9, subsequently, completely removing the sacrificial layer 30 by etching, the sacrificial layer 30 which is located in the spacer regions 213 of the insulation layer 20 and located beneath the cap layer 40 are completely removed by etching through an empty (filled with nothing) space of the cap layer 40;

As shown in FIG. 10, utilizing a clearance of the cap layer 40 and the spacer regions 213 of the hollow insulation layer 20 to etch a space 11 into the silicon substrate 10 beneath the suspended structure 211 of the micro-electro-mechanical structure 21, this space 11 is used to realize the suspension of the suspended structure 211;

Ultimately, as shown in FIG. 11, depositing a sealing layer 50 outside the cap layer 40 and fully sealing the clearance of the cap layer 40.

The method for fabricating the sealed cavity microstructure in accordance with the first embodiment has the following advantages:

First, reducing the exposure and the probability of damage of the micro-electro-mechanical structure, when the sacrificial layer 30 of the present invention is removed by etching and the suspended structures 211 of the micro-electro-mechanical structure 21 achieves the suspension by etching, the cap layer 40 acts as a protective layer to prevent dust and particles, thus effectively preventing the exposure of the suspended structures 211 of the micro-electro-mechanical structure 21 and reducing the probability of damage thereof;

Second, the cap layer 40 over the insulation layer 20 can be directly used as a protective layer of the sealing layer 50, and the exposed surface of conductive structure 212 can be provided for wire bonding to conduct electric circuits, so the complicated and expensive package process can be removed from the present invention;

Third, it is the most important that, the present invention utilizes the etching of the silicon substrate 10 to realize the suspension of the suspended structures 211, thus reducing the package cost of fabricating multiple sacrificial layers and the troublesome procedures;

Fourth, the key advantage is that, since the holes 31 of the sacrificial layer 30 reach to the surface of the conductive structure 212 of the micro-electro-mechanical structure 21, if the cap layer 40 of the present invention is made of one of the conductive materials: aluminum, nickel, silver, copper, titanium, tungsten and gold. This conductive cap layer 40 can be conducted with the conductive structure 212 of the micro-electro-mechanical structure 21 and used as a connection part of an electric circuit (such as: directly serve as a conductive part of the wire bonding).

Thereby, the cap layer 40 and the micro-electro-mechanical structure 21 can be integrally designed as a part of the electric circuit due to the conduction therebetween, thus effectively increasing a continuous operation function of the cap layer 40 after the fabricating process and reducing the package cost by integrating the conduction design as a part of the electric circuit.

Figure 12:
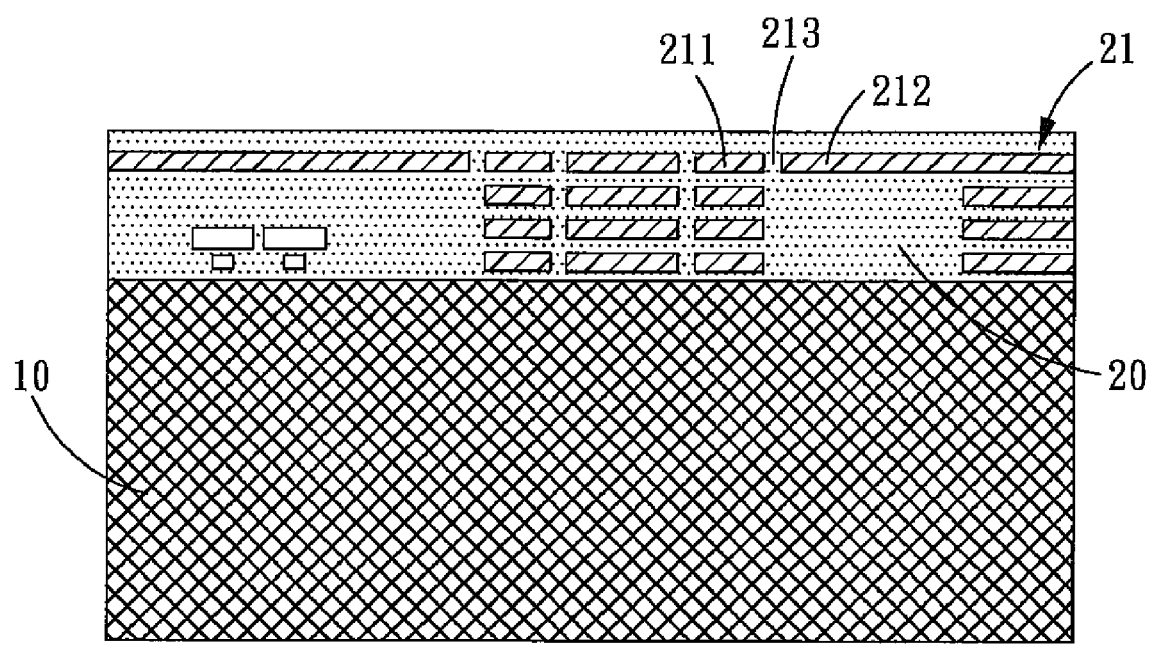
FIG. 12 is a cross sectional view showing a first step of the method for fabricating a sealed cavity microstructure in accordance with a second embodiment of the present invention.
Figure 13:
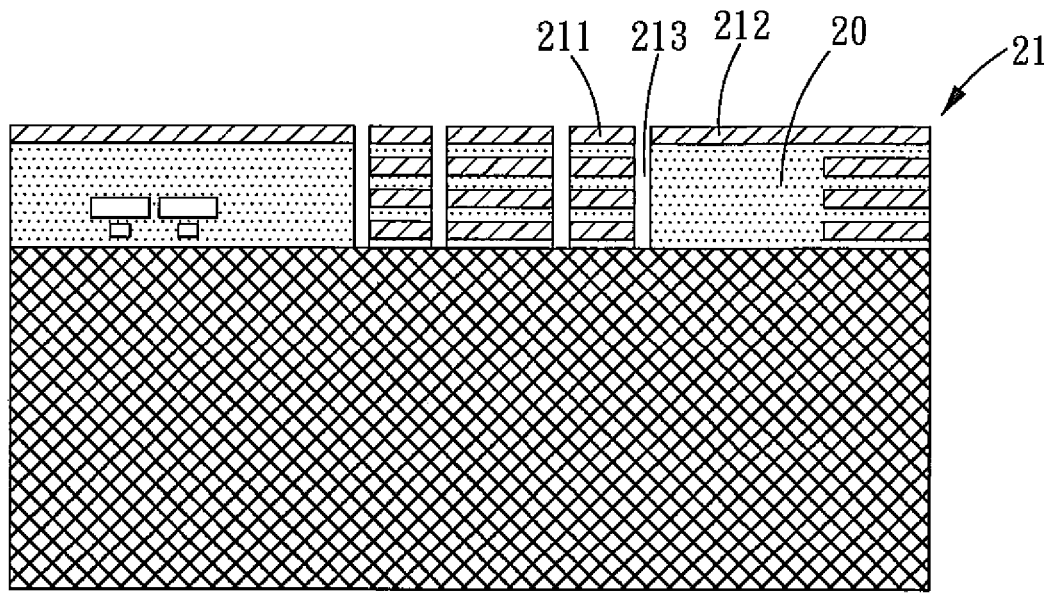
FIG. 13 is a cross sectional view showing a second step of the method for fabricating a sealed cavity microstructure in accordance with the second embodiment of the present invention.
Figure 14:
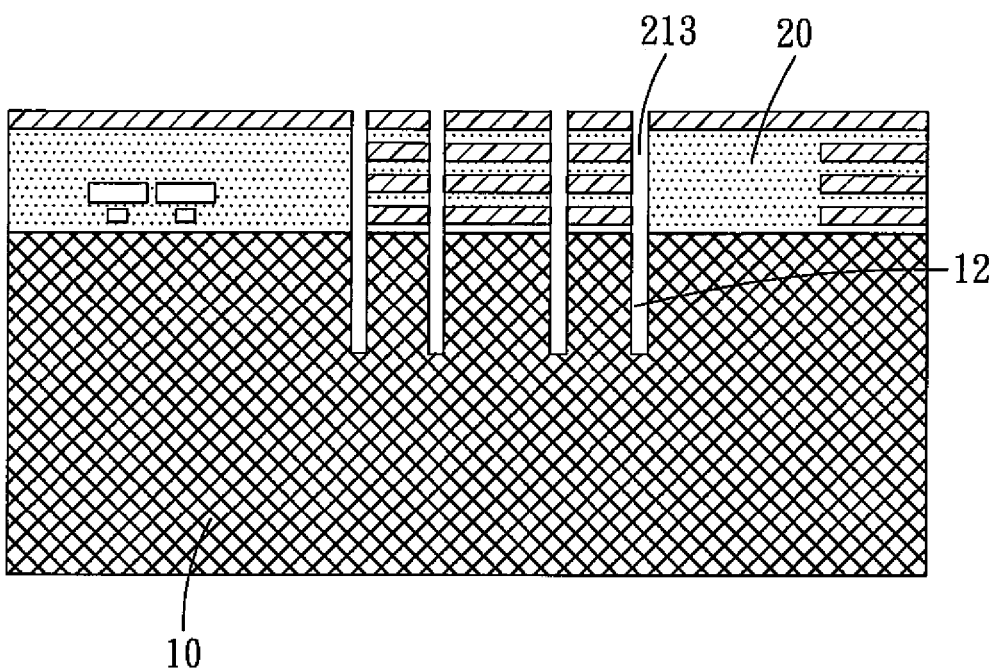
FIG. 14 is a cross sectional view showing a third step of the method for fabricating a sealed cavity microstructure in accordance with the second embodiment of the present invention.
Figure 15:
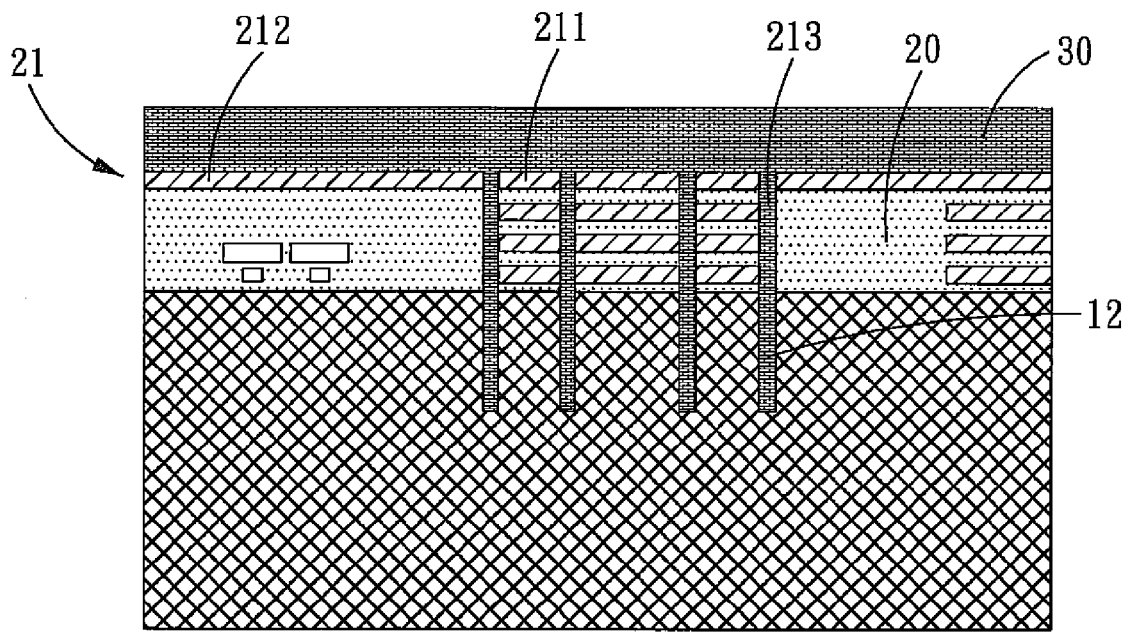
FIG. 15 is a cross sectional view showing a fourth step of the method for fabricating a sealed cavity microstructure in accordance with the second embodiment of the present invention.
Figure 16:
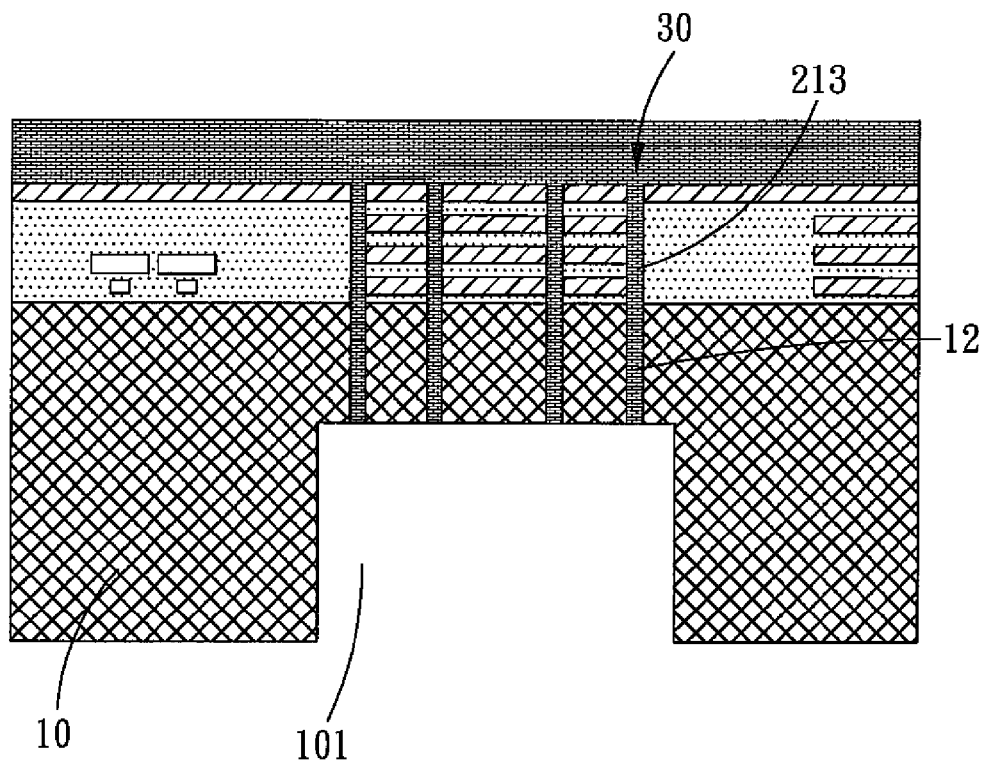
FIG. 16 is a cross sectional view showing a fifth step of the method for fabricating a sealed cavity microstructure in accordance with the second embodiment of the present invention.
Figure 17:
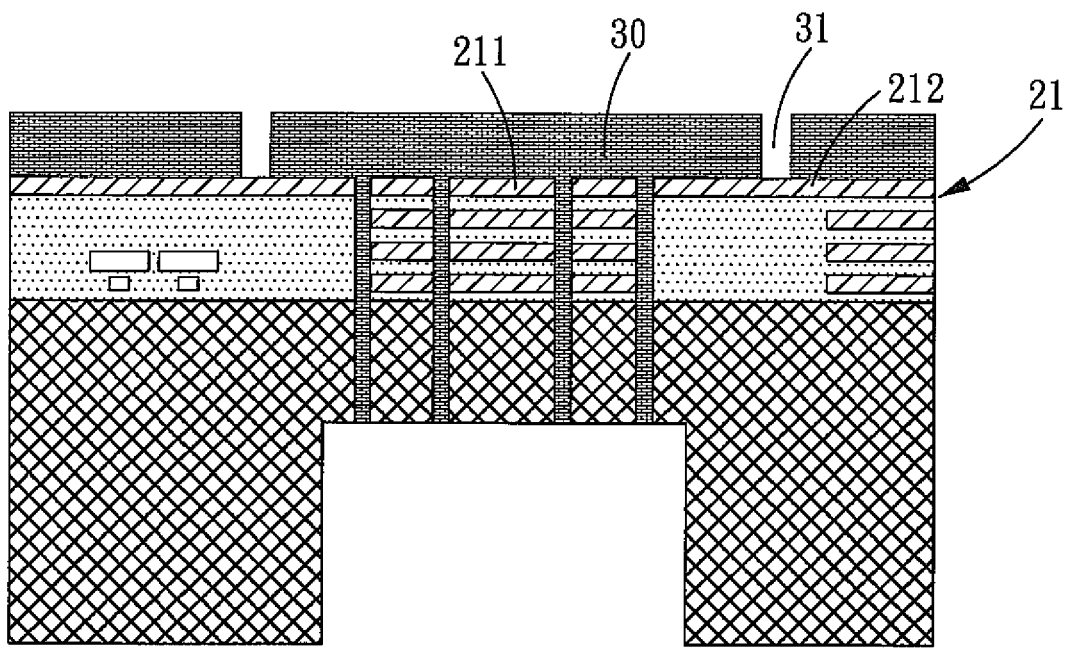
FIG. 17 is a cross sectional view showing a sixth step of the method for fabricating a sealed cavity microstructure in accordance with the second embodiment of the present invention.
Figure 18:
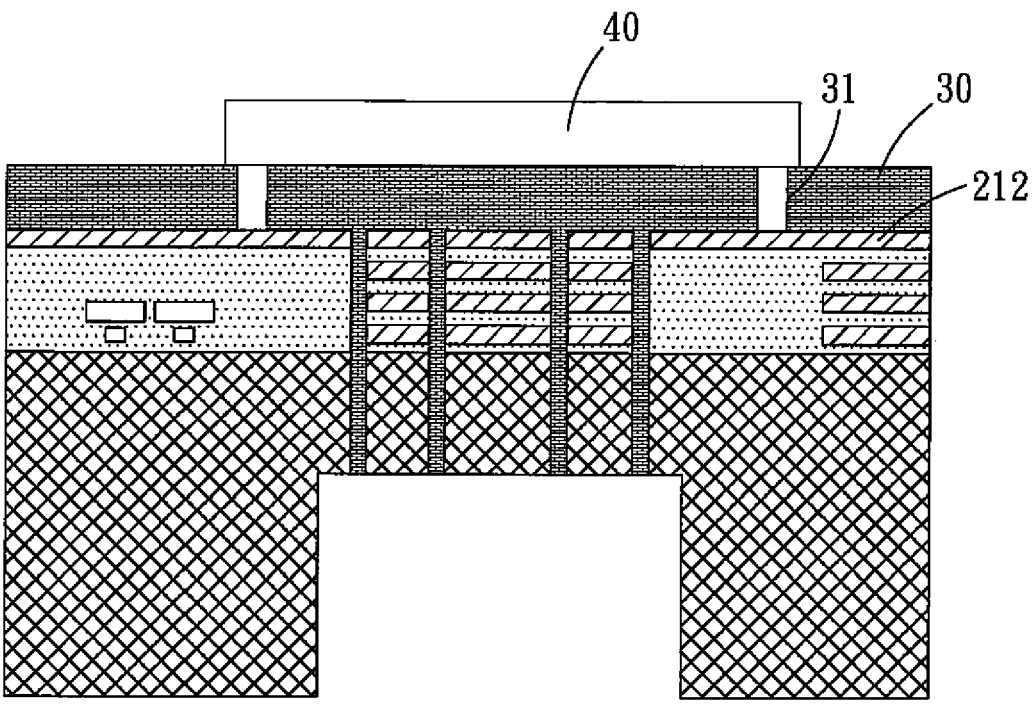
FIG. 18 is a cross sectional view showing a seventh step of the method for fabricating a sealed cavity microstructure in accordance with the second embodiment of the present invention.
Figure 19:
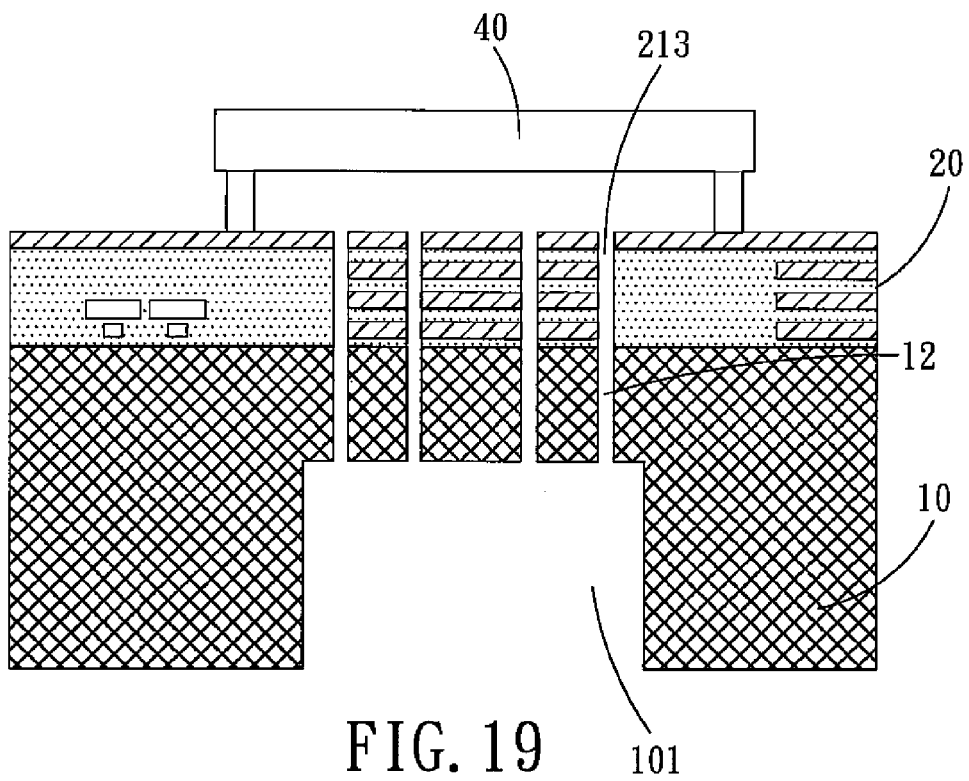
FIG. 19 is a cross sectional view showing an eighth step of the method for fabricating a sealed cavity microstructure in accordance with the second embodiment of the present invention.
Figure 20:
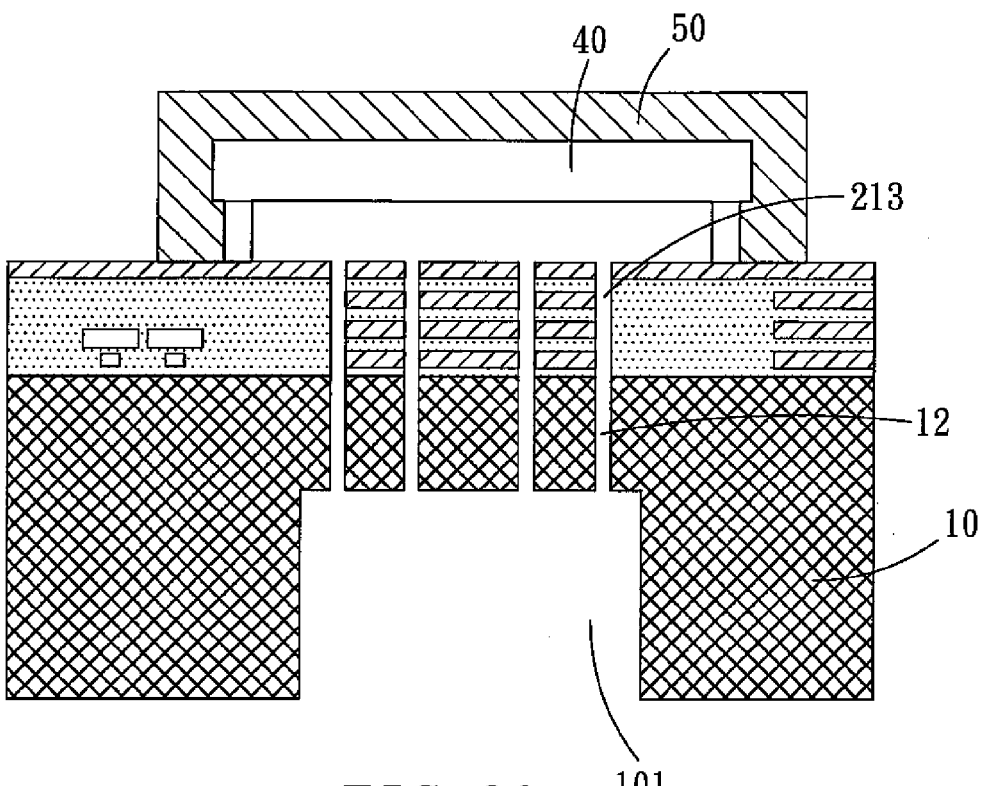
FIG. 20 is a cross sectional view showing a ninth step of the method for fabricating a sealed cavity microstructure in accordance with the second embodiment of the present invention.

FIGS. 12-20 illustrate a method for fabricating a sealed cavity microstructure in accordance with a second embodiment of the present invention. The following embodiments adopt the implementations in which the cap layers are made of conductive material, which are only the selective modes of the important implementations, but not to limit the scope of the technology of the present implementation. The method for fabricating a sealed cavity microstructure in accordance with the second embodiment comprises the steps of:

As shown in FIG. 12, firstly, depositing an insulation layer 20 with a micro-electro-mechanical structure 21 on an upper surface of a silicon substrate 10, the micro-electro-mechanical structure 21 includes a plurality groups of stacked suspended structures 211 and at least one conductive structure 212 surrounding thereof, between the respective suspended structures 211 and between the respective suspended structures 211 and the conductive structure 212 are both disposed spacer regions 213, the micro-electro-mechanical structure 21 is clad by the insulation layer 20;

As shown in FIG. 13, etching the insulation layer 20 by RIE (reactive ion etching), after the insulation layer 20 is etched by RIE, the suspended structures 211 and the conductive structure 212 of the micro-electro-mechanical structure 21 are exposed outside, and the spacer regions 213 which are located between the respective suspended structures 211 and located between the respective suspended structures 211 and the conductive structure 212 are also etched into hollow configurations;

As shown in FIG. 14, subsequently, etching the silicon substrate 10 along the spacer regions 213 of the insulation layer 20 by DRIE (deep reactive ion etching) and forming hollow etching channels 12 with consistent predetermined depths by etching;

As shown in FIG. 15, cladding a sacrificial layer 30 over the insulation layer 20, the sacrificial layer 30 is filled into the spacer regions 213 and the hollow etching channels 12, and the sacrificial layer 30 is covered over the surfaces of the suspended structures 211 and the conductive structure 212 of the micro-electro-mechanical structure 21;

As shown in FIG. 16, conducting an etching from the lower rear surface of the silicon substrate 10 and directionally forming a space 101 which connects with the hollow etching channels 12;

As shown in FIG. 17, forming a plurality of holes 31 in the sacrificial layer 30, the holes 31 are regularly formed over the conductive structure 212, and the holes 31 reach to the surface of the conductive structure 212 of the micro-electro-mechanical structure 21 and arranged to surround the suspended structures 211 of the micro-electro-mechanical structure 21;

As shown in FIG. 18, depositing a cap layer 40 on the surface of the sacrificial layer 30, the cap layer 40 adopts a conductive material, and the cap layer 40 covers the plurality of holes 31, and the cap layer 40 is filled into the holes 31 and contacts the surface of the conductive structure 212;

As shown in FIG. 19, subsequently, completely removing the sacrificial layer 30 by etching, the sacrificial layer 30 which is located inside the spacer regions 213 of the insulation layer 20, the sacrificial layer 30 which is located beneath the cap layer 40 and the sacrificial layer 30 which is located inside the hollow etching channels 12 of the silicon substrate 10 are all completely removed by etching though the empty space of the cap layer 40, the hollow channels 12 connect with the space 101 of the silicon substrate 10, at one side of the suspended structures 211 is remained a suspended silicon substrate 10 having a predetermined thickness for adjusting and controlling the physical properties of the suspended structures 211 according to the requirements;

As shown in FIG. 20, lastly, depositing a sealing layer 50 outside the cap layer 40 to substantially seal the clearance of the cap layer 40, at this moment, the suspension of the suspended structures 211 can be realized by use of the clearance of the cap layer 40, the spacer regions 213 of the hollow insulation layer 20, the hollow etching channels 12 of the substrate 10 and the space 101 in the substrate 10.

The method for fabricating a sealed cavity microstructure in accordance with the above embodiment of the present invention has the following advantages:

First, reducing the exposure and the probability of damage of the micro-electro-mechanical structure;

Second, removing the complicated and expensive package process;

Third, reducing the package cost and the troublesome procedures caused by fabricating multiple sacrificial layers and the conductive structure can be provided for wire bonding to conduct an electric circuit;

Fourth, directly using the cap layer 40 to integrally design as a part of the electric circuit, so as to effectively increase the function of the cap layer and reduce the package cost;

Fifth, achieving a free control of the thickness and weight of the suspended structures 211, the suspended silicon substrate 10 with a predetermined thickness which is remained at one side of the suspended structures 211 can be provided for the user to adjust and control the physical properties such as weight or torque of the suspended structures 211 during suspension according to the requirements.

Figure 21:
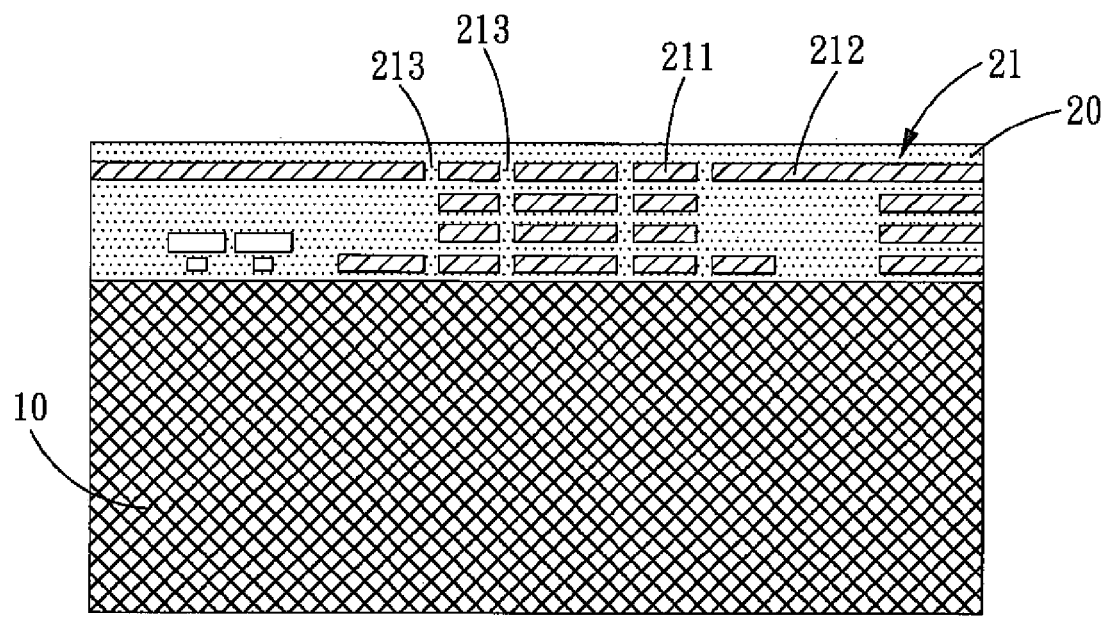
FIG. 21 is a cross sectional view showing a first step of a method for fabricating a sealed cavity microstructure in accordance with a third embodiment of the present invention.
Figure 22:
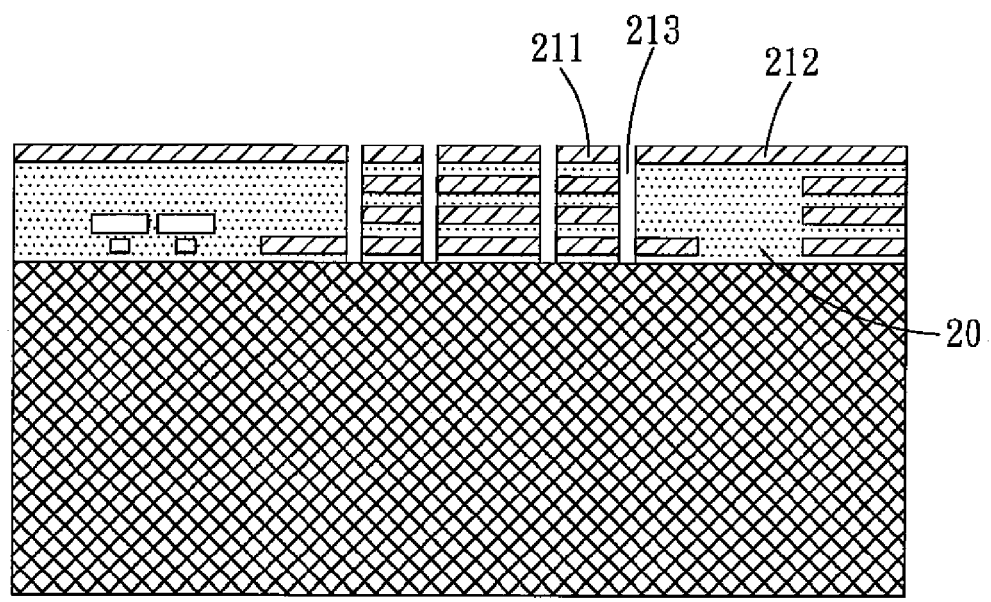
FIG. 22 is a cross sectional view showing a second step of a method for fabricating a sealed cavity microstructure in accordance with the third embodiment of the present invention.
Figure 23:
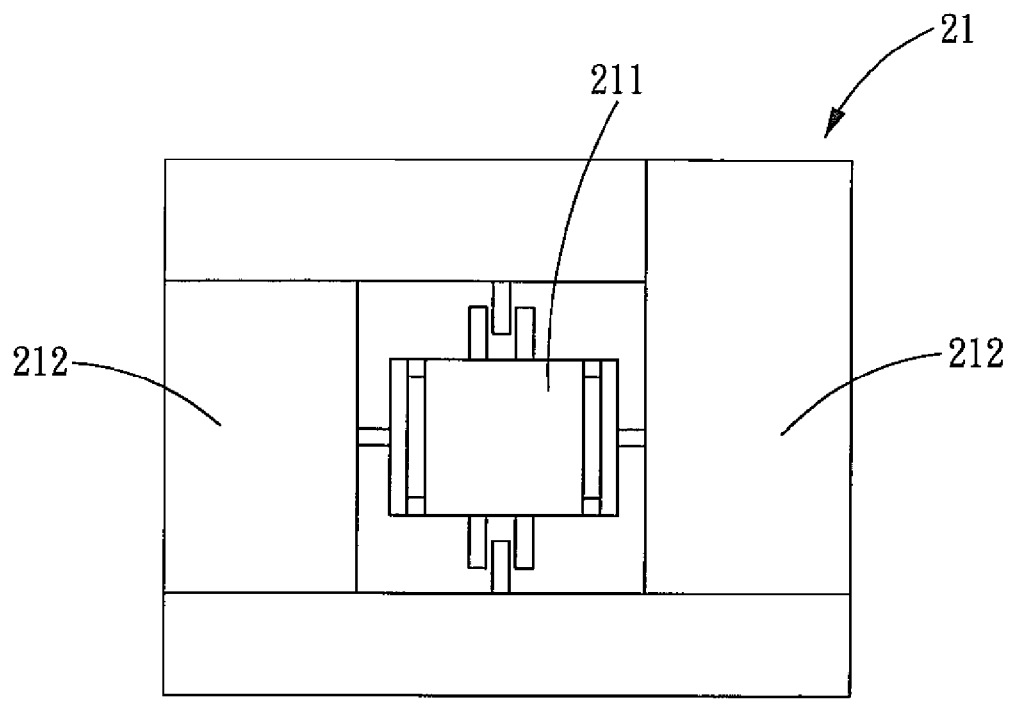
FIG. 23 is a cross sectional view showing a third step of a method for fabricating a sealed cavity microstructure in accordance with the third embodiment of the present invention.
Figure 24:
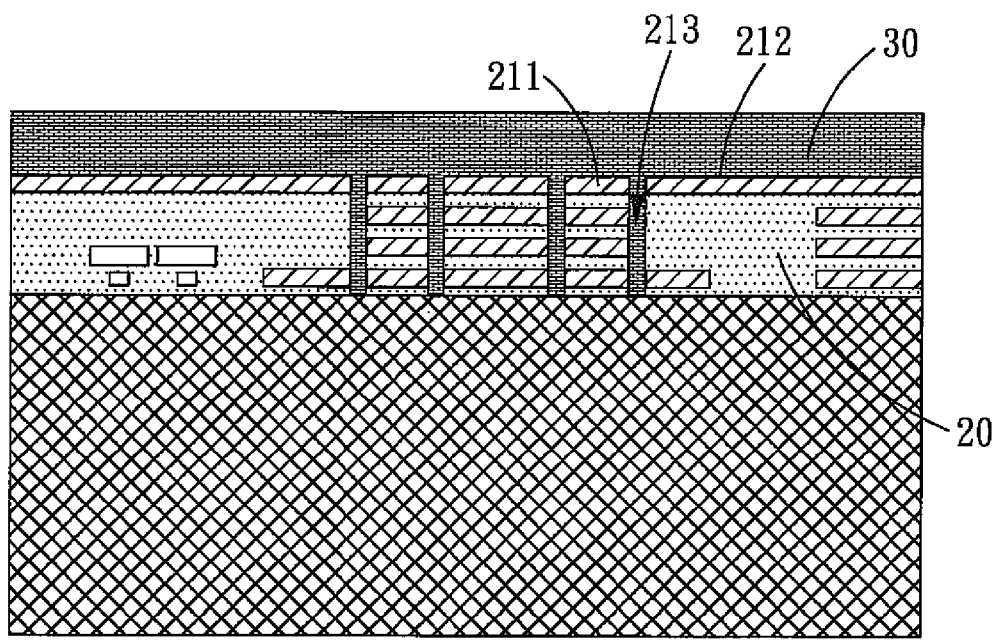
FIG. 24 is a cross sectional view showing a fourth step of a method for fabricating a sealed cavity microstructure in accordance with the third embodiment of the present invention.
Figure 25:
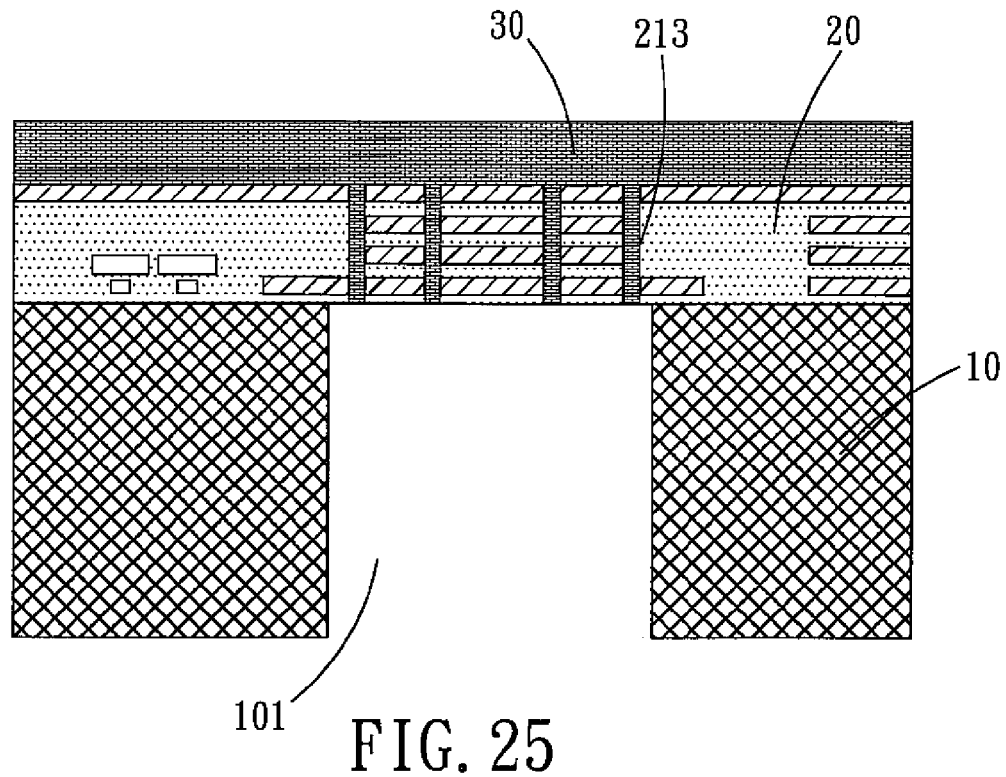
FIG. 25 is a cross sectional view showing a fifth step of a method for fabricating a sealed cavity microstructure in accordance with the third embodiment of the present invention.
Figure 26:
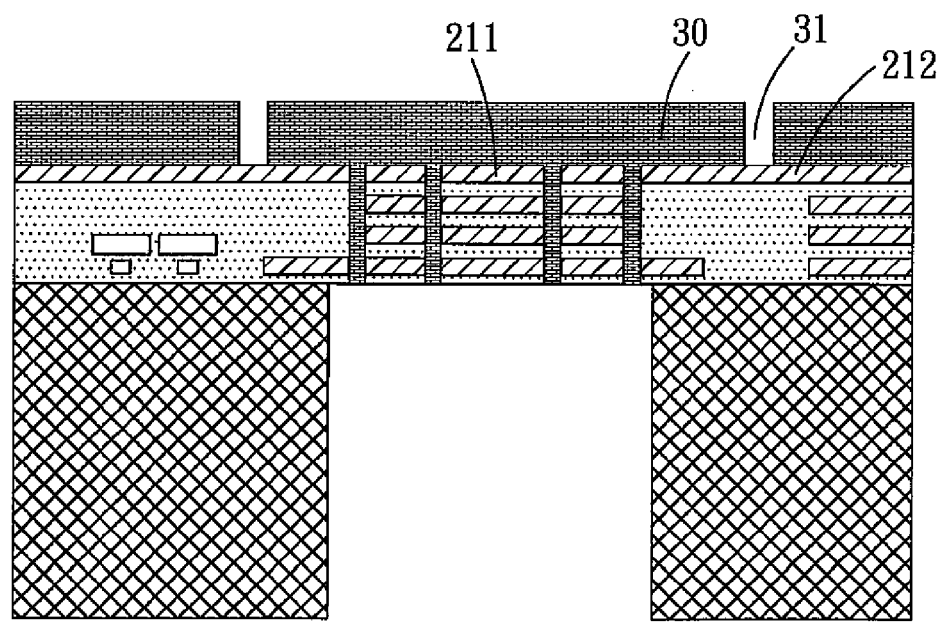
FIG. 26 is a cross sectional view showing a sixth step of a method for fabricating a sealed cavity microstructure in accordance with the third embodiment of the present invention.
Figure 27:
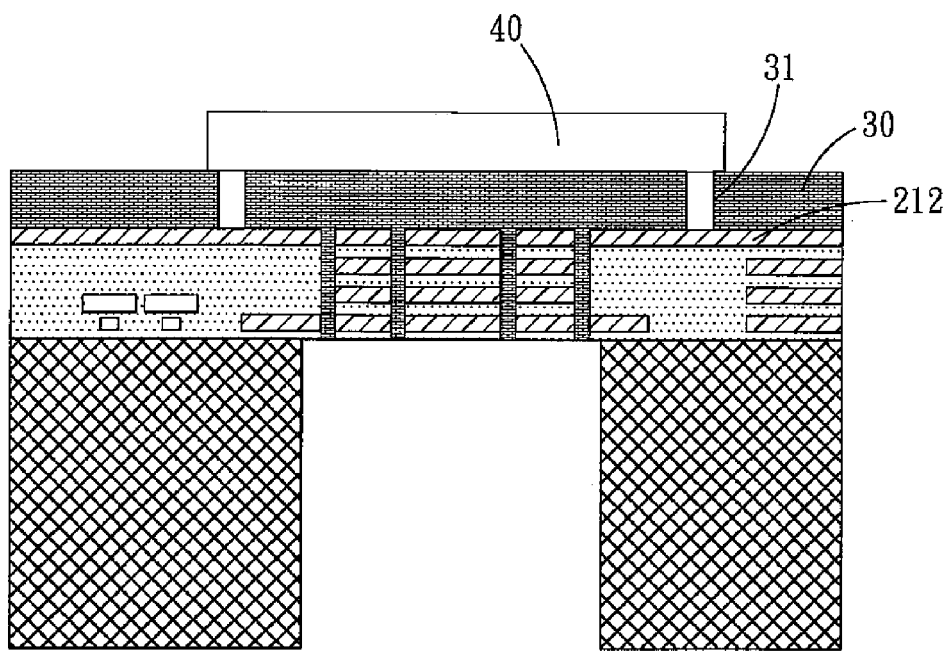
FIG. 27 is a cross sectional view showing a seventh step of a method for fabricating a sealed cavity microstructure in accordance with the third embodiment of the present invention.
Figure 28:
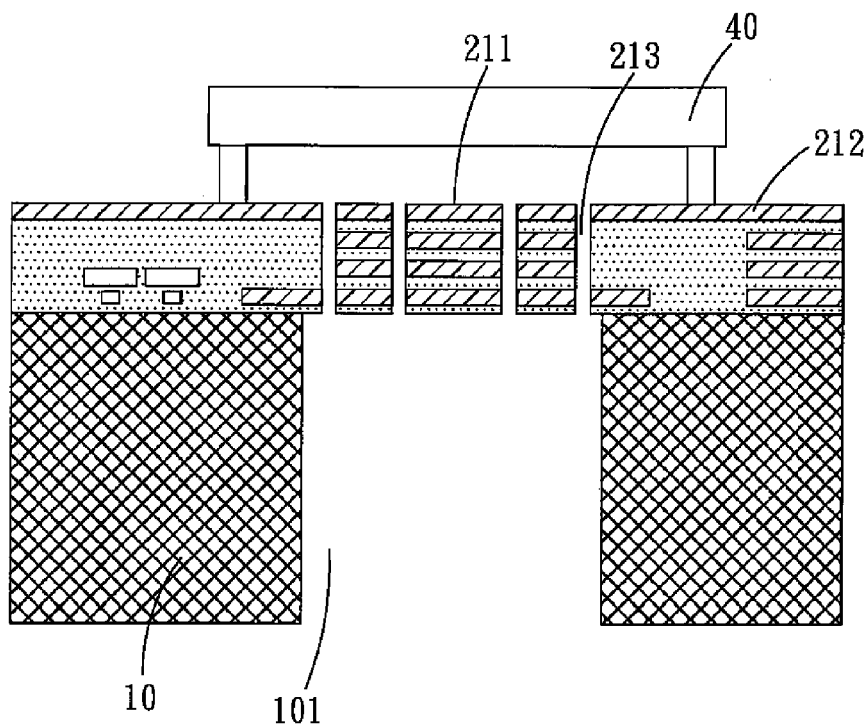
FIG. 28 is a cross sectional view showing an eighth step of a method for fabricating a sealed cavity microstructure in accordance with the third embodiment of the present invention.
Figure 29:
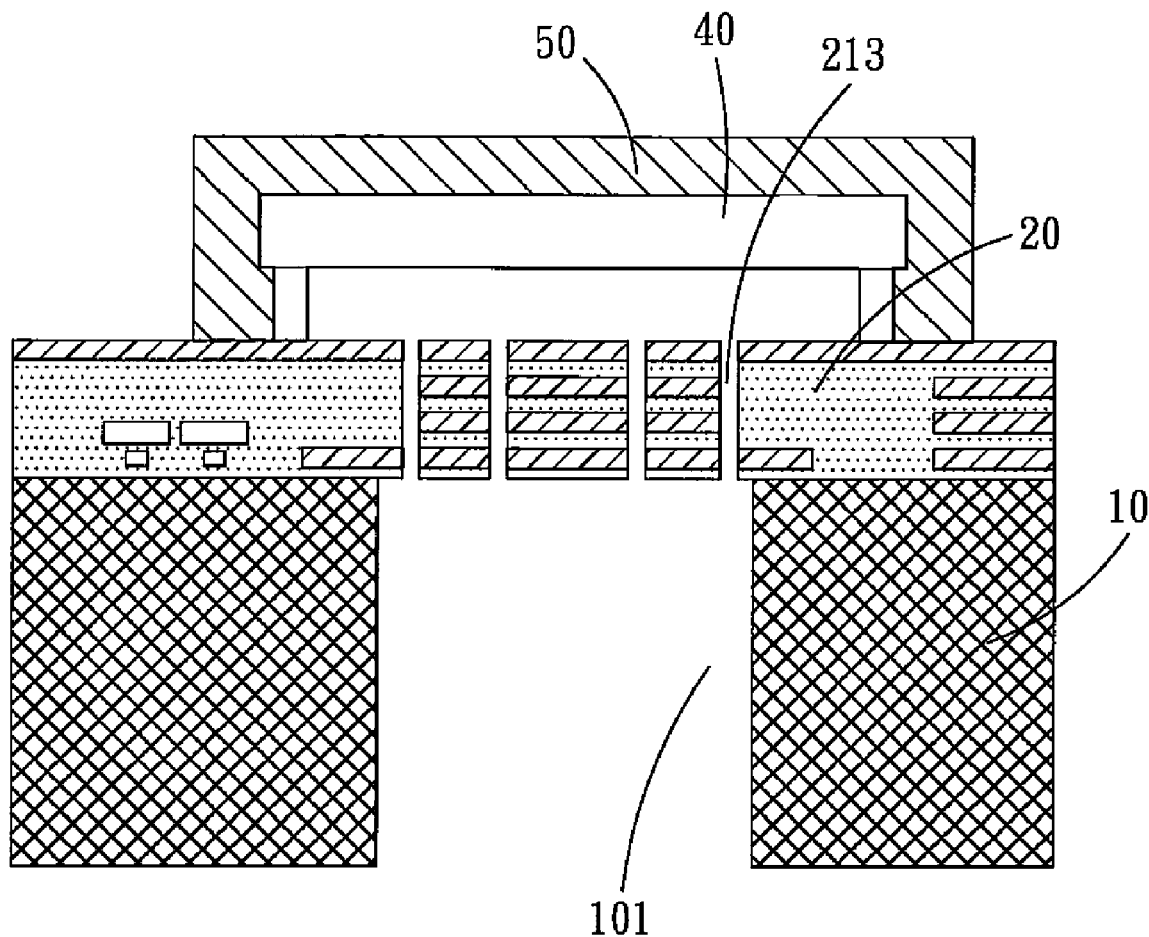
FIG. 29 is a cross sectional view showing a ninth step of a method for fabricating a sealed cavity microstructure in accordance with the third embodiment of the present invention.

FIGS. 21-29 illustrate a method for fabricating a sealed cavity microstructure in accordance with a third embodiment of the present invention, which is especially suitable for the implementation in which the cap layer adopts the conductive material. The fabricating method comprises the steps of:

As shown in FIG. 21, firstly, depositing an insulation layer 20 with a micro-electro-mechanical structure 21 on an upper surface of a silicon substrate 10, the micro-electro-mechanical structure 21 includes a plurality groups of stacked suspended structures 211 and some conductive structures 212 surrounding thereof, the conductive structures 212 are independent from each other, between the respective suspended structures 211 and between the respective suspended structures 211 and the respective conductive structures 212 are both disposed spacer regions 213, the micro-electro-mechanical structure 21 is clad by the insulation layer 20;

As shown in FIGS. 22-23, etching the insulation layer 20 by RIE (reactive ion etching), after the insulation layer 20 is etched by RIE, the suspended structures 211 and the conductive structures 212 of the micro-electro-mechanical structures 21 are exposed outside, and the spacer regions 213 which are located between the respective suspended structures 211 and located between the respective suspended structures 211 and the respective conductive structures 212 are also etched into hollow configurations;

As shown in FIG. 24, cladding a sacrificial layer 30 over the insulation layer 20, the sacrificial layer 30 is filled into the spacer regions 213, and the sacrificial layer 30 covers the surfaces of the suspended structures 211 and the conductive structures 212 of the micro-electro-mechanical structure 21;

As shown in FIG. 25, conducting an etching from the lower rear surface of the silicon substrate 10, and directionally forming a space 101 connecting with the spacer regions 213 in the silicon substrate 10;

As shown in FIG. 26, forming a plurality of holes 31 in the sacrificial layer 30, the holes 31 are regularly formed over the respective conductive structures 212 and reach to the surface of the respective conductive structures 212 of the micro-electro-mechanical structure 21 and surround the suspended structures 211 of the micro-electro-mechanical structure 21;

As shown in FIG. 27, depositing a cap layer 40 on the surface of the sacrificial layer 30, the cap layer 40 adopts a conductive material and covers the plurality of holes 31, and the cap layer 40 contacts the surfaces of the conductive structures 212 after being filler in the holes 31;

As shown in FIG. 28, subsequently, completely removing the sacrificial layer by etching, the sacrificial layer 30 which is located inside the spacer regions 213 of the insulation layer 20, the sacrificial layer 30 which is located beneath the cap layer 40 are both completely removed by etching though an empty space of the cap layer 40, and the spacer regions 213 connect with the space 101 of the silicon substrate 10;

As shown in FIG. 29, depositing a sealing layer 50 outside the cap layer 40 and substantially sealing the clearance of the cap layer 40, at this moment, the suspension of the suspended structures 211 can be realized by use of the clearance of the cap layer 40, the spacer regions 213 of the insulation layer 20 and the space 101 of the silicon substrate 10;

The above method for fabricating a sealed cavity microstructure in accordance with the third embodiment of the present invention has the following advantages:

First, reducing the exposure and the probability of damage of the micro-electro-mechanical structure;

Second, removing the complicated and expensive package process;

Third, reducing the package cost and the troublesome procedures caused by fabricating multiple sacrificial layers and the conductive structure can be provided for wire bonding to conduct an electric circuit;

Fourth, directly using the cap layer 40 to integrally design as a part of the electric circuit, and reducing the package cost;

Fifth, achieving a free control of the thickness and weight of the suspended structures 211;

Sixth, providing the exposed surfaces of the conductive structures 212 for the wire boning to conduct the electric circuit, the conductive structures 212 which are independent from each other are used to connect with the cap layer 40, the respective conductive structures 212 can be set with different electric circuit functions, and the different conductive structures 212 can be used to connect with the different suspended structures 211, so as to carry out a more complicated circuit design variation.

Figure 30:
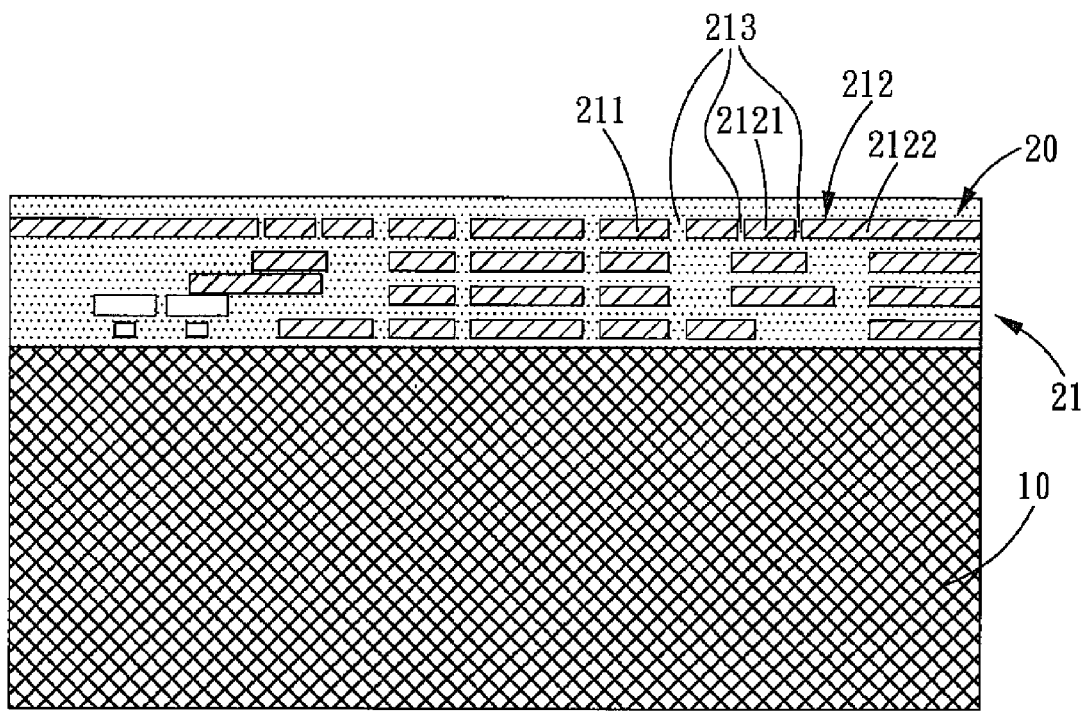
FIG. 30 is a cross sectional view showing a first step of a method for fabricating a sealed cavity microstructure in accordance with a fourth embodiment of the present invention.
Figure 31:
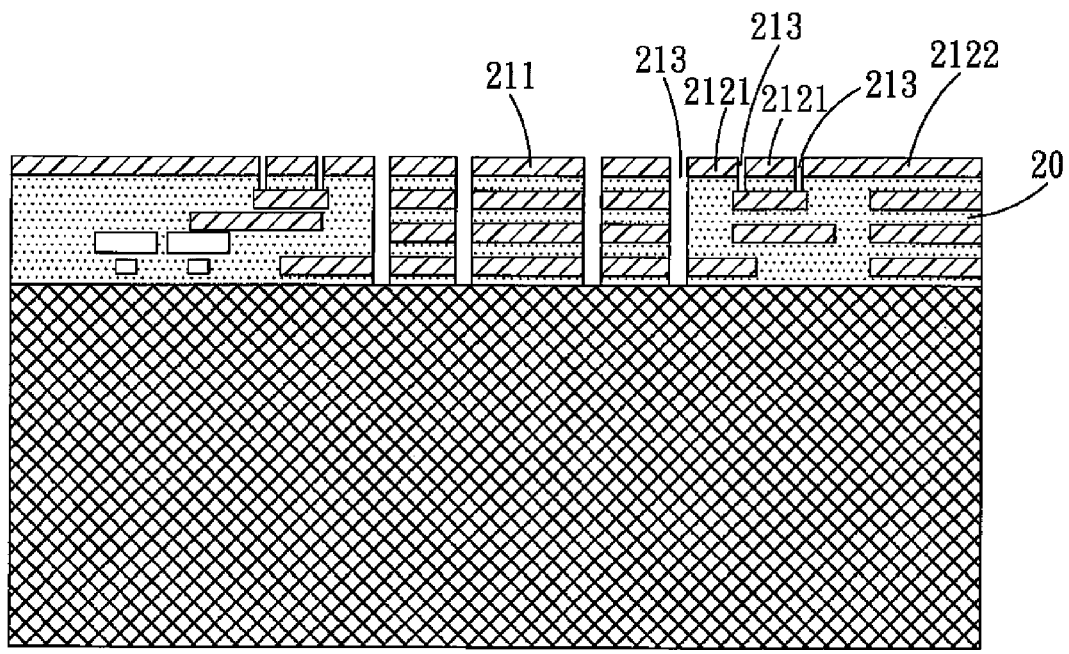
FIG. 31 is a cross sectional view showing a second step of a method for fabricating a sealed cavity microstructure in accordance with the fourth embodiment of the present invention.
Figure 32:
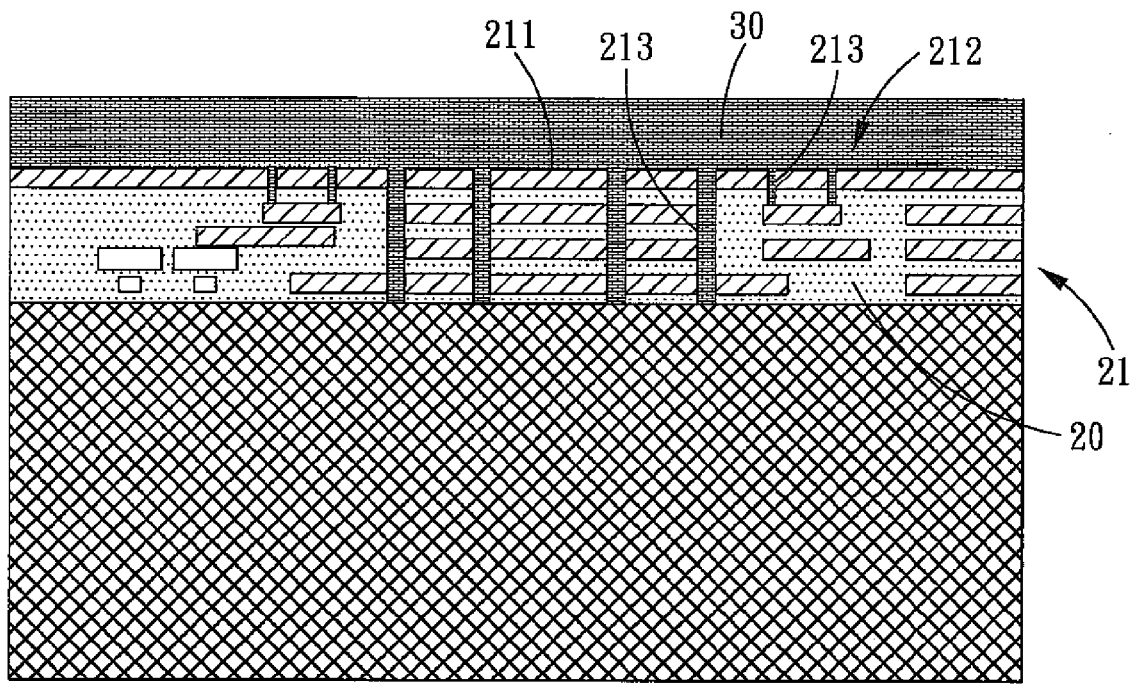
FIG. 32 is a cross sectional view showing a third step of a method for fabricating a sealed cavity microstructure in accordance with the fourth embodiment of the present invention.
Figure 33:
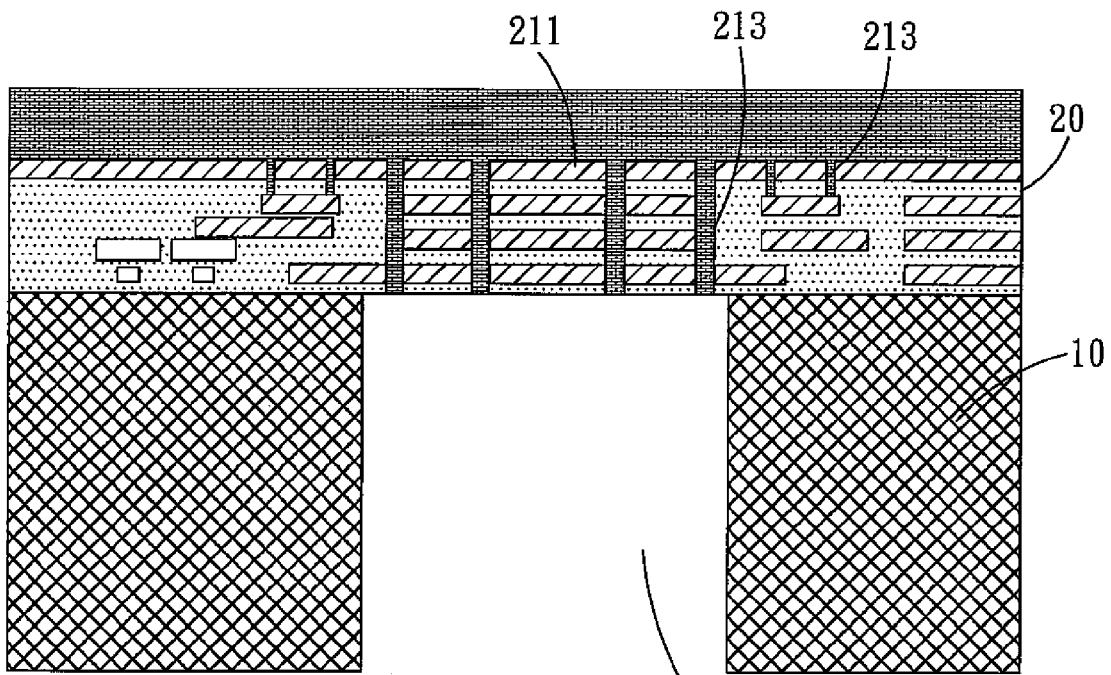
FIG. 33 is a cross sectional view showing a fourth step of a method for fabricating a sealed cavity microstructure in accordance with the fourth embodiment of the present invention.
Figure 34:
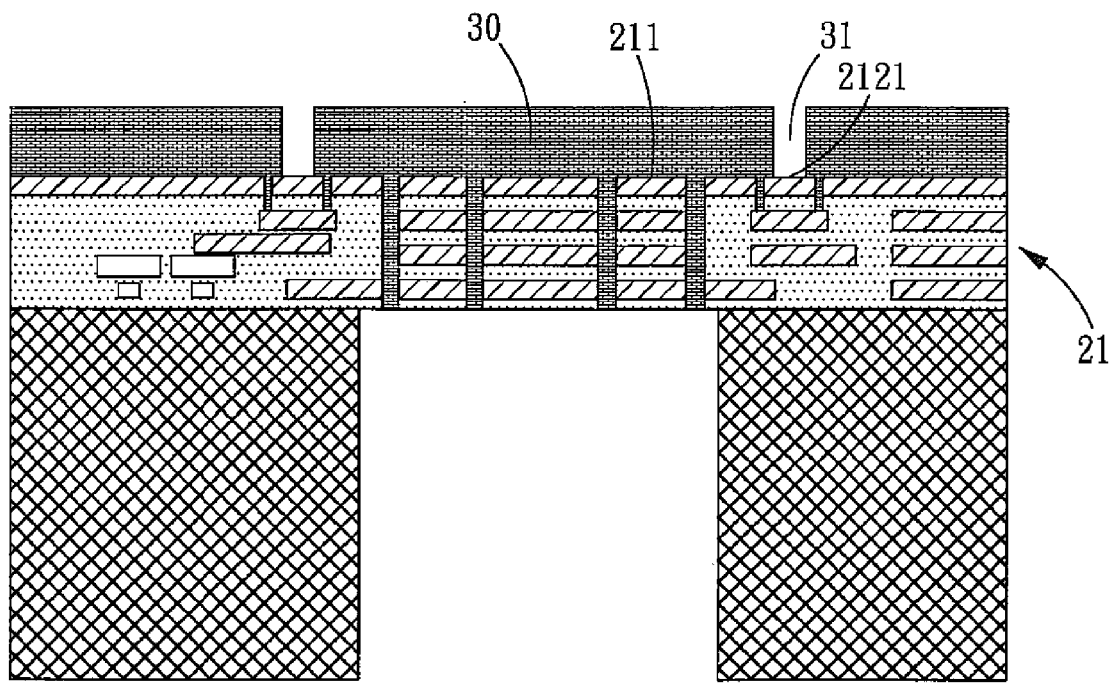
FIG. 34 is a cross sectional view showing a fifth step of a method for fabricating a sealed cavity microstructure in accordance with the fourth embodiment of the present invention.
Figure 35:
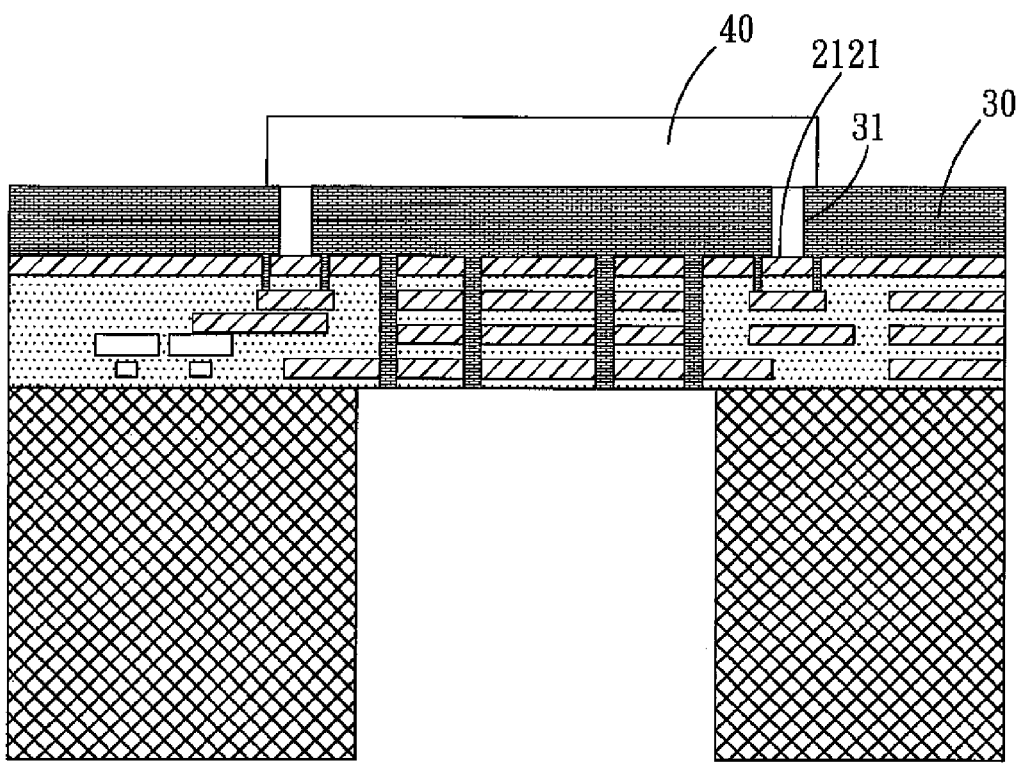
FIG. 35 is a cross sectional view showing a sixth step of a method for fabricating a sealed cavity microstructure in accordance with the fourth embodiment of the present invention.
Figure 36:
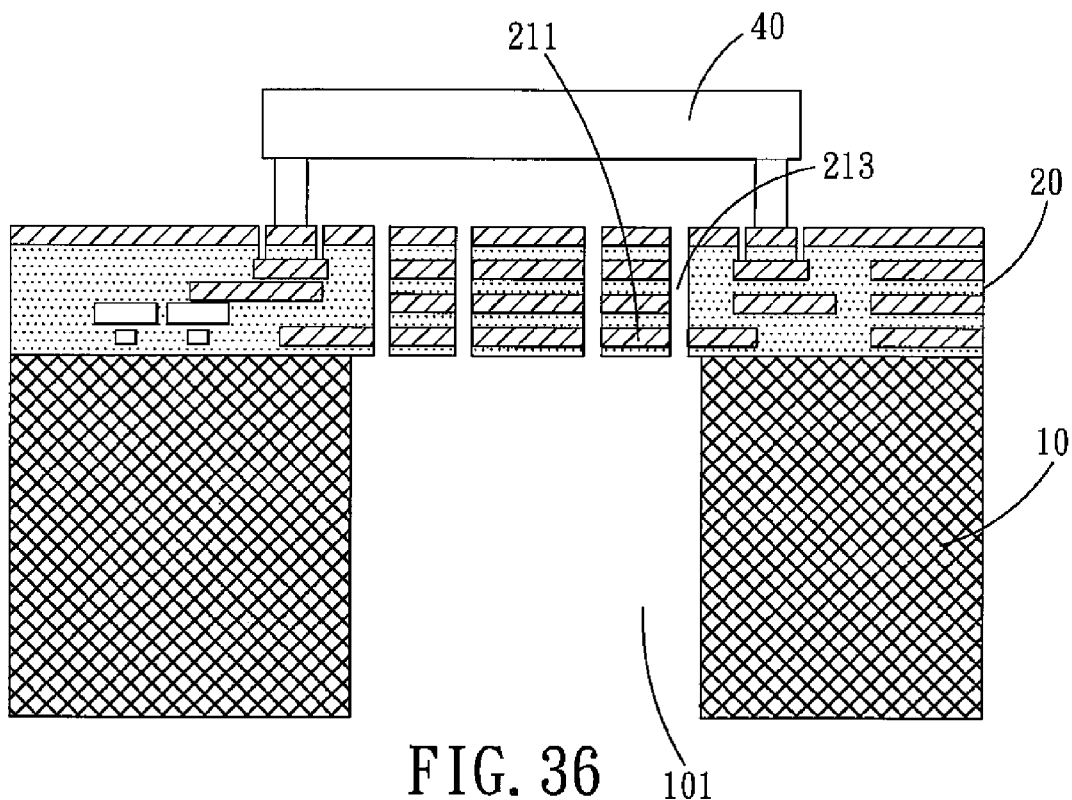
FIG. 36 is a cross sectional view showing a seventh step of a method for fabricating a sealed cavity microstructure in accordance with the fourth embodiment of the present invention.
Figure 37:
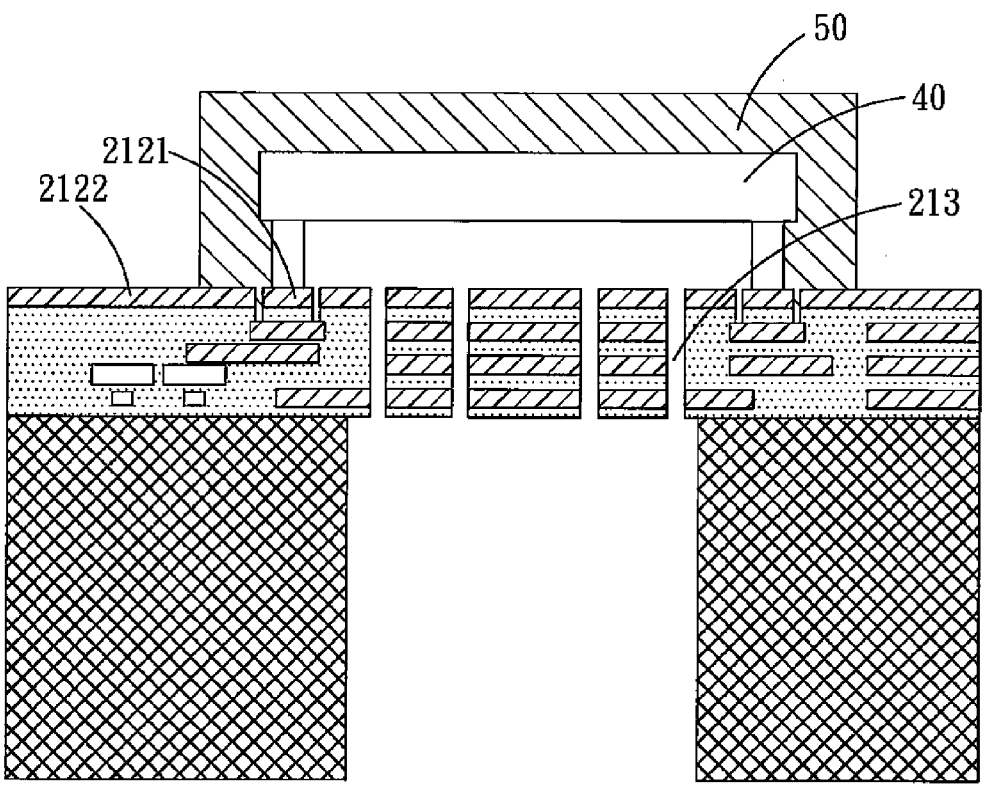
FIG. 37 is a cross sectional view showing an eighth step of a method for fabricating a sealed cavity microstructure in accordance with the fourth embodiment of the present invention.

FIGS. 30-37 illustrate a method for fabricating a sealed cavity microstructure in accordance with a fourth embodiment of the present invention which is especially suitable for the implementation in which the cap layer adopts the conductive material. The fabricating method comprises the steps of:

As shown in FIG. 30, firstly, depositing an insulation layer 20 with a micro-electro-mechanical-structure 21 on an upper surface of a silicon substrate 10, the micro-electro-mechanical structure 21 includes a plurality groups of stacked suspended structures 211 and some conductive structures 212 surrounding thereof, the conductive structure 212 includes, from inside to outside, an inner loop 2121 and an outer loop 2122 that are independent from each other, between the respective suspended structures 211 and outside the respective suspended structures 211 are both disposed spacer regions 213, and the spacer regions 213 are further disposed between the inner loop 2121 and the outer loop 2122 of the respective conductive structures 212, the micro-electro-mechanical structure 21 is clad by the insulation layer 20;

As shown in FIG. 31, etching the insulation layer 20 by RIE, after the insulation layer 20 is etched by RIE, the suspended structures 211 and the conductive structures 212 (inner loops 2121, outer loops 2122) are exposed outside, and the spacer regions 213 which are located between and outside the respective suspended structures 211 and the spacer regions 213 which are located between the inner loop 2121 and the outer loop 2122 of the respective conductive structures 212 are etched into hollow configurations;

As shown in FIG. 32, cladding a sacrificial layer 30 over the insulation layer 20, the sacrificial layer 30 is filled into the spacer regions 213, and the sacrificial layer 30 covers the surfaces of the suspended structures 211 and the conductive structures 212 (inner loops 2121, outer loops 2122) of the micro-electro-mechanical structure 21;

As shown in FIG. 33, conducting an etching from the lower rear surface of the silicon substrate 10 and directionally forming a space 101 in the silicon substrate 10, the space 101 reaches to the insulation layer 20 and connects with the spacer regions 213 of the corresponding suspended structures 211;

As shown in FIG. 34, forming a plurality of holes 31 in the sacrificial layer 30, the holes 31 are regularly formed over the inner loop 2121 of the respective conductive structures 212, and the holes 31 reach to the surfaces of the inner loops 2121 of the micro-electro-mechanical structure 21 and are arranged to surround the suspended structures 211 of the micro-electro-mechanical structure 21;

As shown in FIG. 35, depositing a cap layer 40 on the surface of the sacrificial layer 30, the cap layer 40 adopts a conductive material and covers the plurality of holes 31, and the cap layer 40 contacts the surfaces of the inner loops 2121 after being filled into the holes 31;

As shown in FIG. 36, subsequently, completely removing the sacrificial layer 30, the sacrificial layer 30 which is located inside the spacer regions 213 of the insulation layer 20, the sacrificial layer 30 which is located beneath the cap layer 40 are both completely removed by etching though an empty space of the cap layer 40 to make part of the spacer regions 213 connect with the space 101 of the silicon substrate 10;

As shown in FIG. 37, ultimately, depositing a sealing layer 50 outside the cap layer 40 and substantially sealing the clearance of the cap layer 40, at this moment, the suspension of the suspended structures 211 can be realized by use of the clearance of the cap layer 40, the hollow spacer regions 213 of the insulation layer 20 and the space 101 in the silicon substrate 10, the surfaces of the exposed outer loops 2122 of the conductive structures 212 can be provided for the wire bonding to conduct the electric circuit, and the inner loops 2121 of the connective structures 212 are connected to the cap layer 40, thus creating the sealed circuit design and setting up different circuit functions.

The above method for fabricating a sealed cavity microstructure in accordance with the fourth embodiment of the present invention has the following advantages:

First, reducing the exposure and the probability of damage of the micro-electro-mechanical structure;

Second, removing the complicated and expensive package process;

Third, reducing the package cost and the troublesome procedures caused by fabricating multiple sacrificial layers;

Fourth, directly integrating and designing the cap layer 40 as a part of the electric circuit, and the surfaces of the exposed outer loops 2122 of the conductive structures 212 can be provided for the wire bonding to conduct the electric circuit, and the inner loops 2121 of the conductive structures 212 are connected to the cap layer 40, thus creating a sealed circuit design effect and setting up different circuit functions.

To summarize, the present invention relates to a method for fabricating a sealed cavity microstructure. The fabricating method comprises the steps of: forming an insulation layer with a micro-electro-mechanical structure on an upper surface of a silicon substrate first, the micro-electro-mechanical structure includes at least one suspended structure and at least one conductive structure between which is disposed a spacer region; filling a sacrificial layer into the spacer region and on the surface of the conductive structure after an etching operation; forming holes in the sacrificial layer correspondingly to the conductive structure; depositing a cap layer into the holes and on the surface; removing the sacrificial layer by etching; and etching the silicon substrate beneath the suspended structure, thus achieving the seal effect after suspension.

Therefore, the present invention can effectively prevent the exposure of the micro-electro-mechanical structure, and further directly use the conduction design of the cap layer and the conductive structure to integrate as a part of the electric circuit, thus reducing the final package cost.

While we have shown and described various embodiments in accordance with the present invention, it is clear to those skilled in the art that further embodiments may be made without departing from the scope of the present invention.

What is claimed is:

1. A method for fabricating a sealed cavity microstructure comprising the steps of:

depositing an insulation layer with a micro-electro-mechanical structure on an upper surface of a silicon substrate, the micro-electro-mechanical structure includes at least one suspended structure and at least one conductive structure, between the suspended structure and the conductive structure is disposed a spacer region, the micro-electro-mechanical structure is clad by the insulation layer;

etching the insulation layer, after the insulation layer is etched, the suspended structure and the conductive structure of the micro-electro-mechanical structure are exposed outside, and the spacer region is etched into a hollow configuration;

cladding a sacrificial layer over the insulation layer, the sacrificial layer is filled into the spacer region, and the sacrificial layer is covered over the suspended structure and the conductive structure of the micro-electro-mechanical structure;

performing an etching from a rear back surface of the silicon substrate and directionally forming space connecting to the spacer region;

forming at least one hole in the sacrificial layer, the hole is formed over the conductive structure;

depositing a cap layer over the sacrificial layer, the cap layer covers the hole of the sacrificial layer, and the cap layer contacts the conductive structure after being filled into the hole of the sacrificial layer;

removing the sacrificial layer by etching, the sacrificial layer inside the spacer region, and the sacrificial layer under the cap layer are both etched through an empty space of the cap layer, and the spacer region connects with the space of the silicon substrate to achieve the suspension of the suspended structure; and depositing a sealing layer outside the cap layer to subsequently seal a clearance of the cap layer.

2. The method for fabricating a sealed cavity microstructure as claimed in claim 1, wherein the micro-electro-mechanical structure includes a plurality groups of stacked suspended structures and conductive structures surrounding thereof.

3. The method for fabricating a sealed cavity microstructure as claimed in claim 1, wherein the sacrificial layer is formed with a plurality of holes, and the holes of the sacrificial layer are arranged surrounding the suspended structure of the micro-electro-mechanical structure, the cap layer covers the plurality of holes.

4. The method for fabricating a sealed cavity microstructure as claimed in claim 2, wherein the sacrificial layer is formed with a plurality of holes, and the holes of the sacrificial layer are arranged surrounding the suspension structure of the micro-electro-mechanical structure, the cap layer covers the plurality of holes.

5. The method for fabricating a sealed cavity microstructure as claimed in claim 3, wherein the holes of the sacrificial layer reach to a surface of the respective conductive structures of the micro-electro-mechanical structure, and the cap layer is made of one of the conductive materials: aluminum, nickel, silver, copper, titanium, tungsten and gold, the cap layer is conductive with the conductive structure of the micro-electro-mechanical structure as a circuit connection.

6. The method for fabricating a sealed cavity microstructure as claimed in claim 4, wherein the holes of the sacrificial layer reach to a surface of the respective conductive structures of the micro-electro-mechanical structure, and the cap layer is made of one of the conductive materials: aluminum, nickel, silver, copper, titanium, tungsten and gold, the cap layer is conductive with the conductive structure of the micro-electro-mechanical structure as a circuit connection.

* * * * *